United States Patent
Jiang et al.

(10) Patent No.: US 8,541,997 B2
(45) Date of Patent: Sep. 24, 2013

(54) CURRENT SENSING SIGNAL COMPARING DEVICE, AND CURRENT SENSING SIGNAL COMPARING METHOD

(75) Inventors: Jian Jiang, Shanghai (CN); Qikun Wu, Shanghai (CN); Xiaoni Xin, Shanghai (CN); Bin Wang, Shanghai (CN); Hongyang Wu, Shanghai (CN)

(73) Assignee: Delta Electronics, Inc., Taoyuan Hsien (TW)

( * ) Notice: Subject to any disclaimer, the term of this patent is extended or adjusted under 35 U.S.C. 154(b) by 426 days.

(21) Appl. No.: 12/915,884

(22) Filed: Oct. 29, 2010

(65) Prior Publication Data
US 2011/0103112 A1 May 5, 2011

Related U.S. Application Data

(60) Provisional application No. 61/256,646, filed on Oct. 30, 2009.

(51) Int. Cl.
G05F 1/575 (2006.01)
H02M 3/335 (2006.01)

(52) U.S. Cl.
USPC ..... 323/282; 323/277; 363/21.02; 363/21.09; 363/21.17; 324/720

(58) Field of Classification Search
USPC ............... 363/16, 21.02, 21.09, 21.17, 97, 363/131; 323/277, 285, 356, 357, 358, 282; 324/127, 652, 713, 720
See application file for complete search history.

(56) References Cited

U.S. PATENT DOCUMENTS

| | | | | | |
|---|---|---|---|---|---|
| 5,060,131 | A | * | 10/1991 | Sikora | 363/97 |
| 5,105,352 | A | * | 4/1992 | Iwasa et al. | 363/98 |
| 6,518,773 | B1 | * | 2/2003 | Matsui et al. | 324/609 |
| 6,700,365 | B2 | * | 3/2004 | Isham et al. | 323/317 |
| 7,432,695 | B2 | * | 10/2008 | Salerno | 323/284 |
| 2010/0259953 | A1 | * | 10/2010 | Matthews | 363/20 |

* cited by examiner

Primary Examiner — Gary L Laxton
(74) Attorney, Agent, or Firm — Kirton McConkie; Evan R. Witt

(57) ABSTRACT

Provided is a current sensing signal comparing device and current sensing signal comparing method. The current sensing signal comparing device includes a current sensing circuit for detecting a current signal of a switching circuit and thereby generating a current sensing signal, a control unit for outputting a control signal, and a compensating circuit for compensating the current sensing signal according to the control signal. The compensated current sensing signal is compared with a constant current reference signal in order to issue a constant current control signal. The device can also be provided to configure the compensating circuit to compensate the constant current reference signal, such that the current sensing signal is compared with the compensated constant current reference signal in order to issue a constant current control signal.

15 Claims, 34 Drawing Sheets

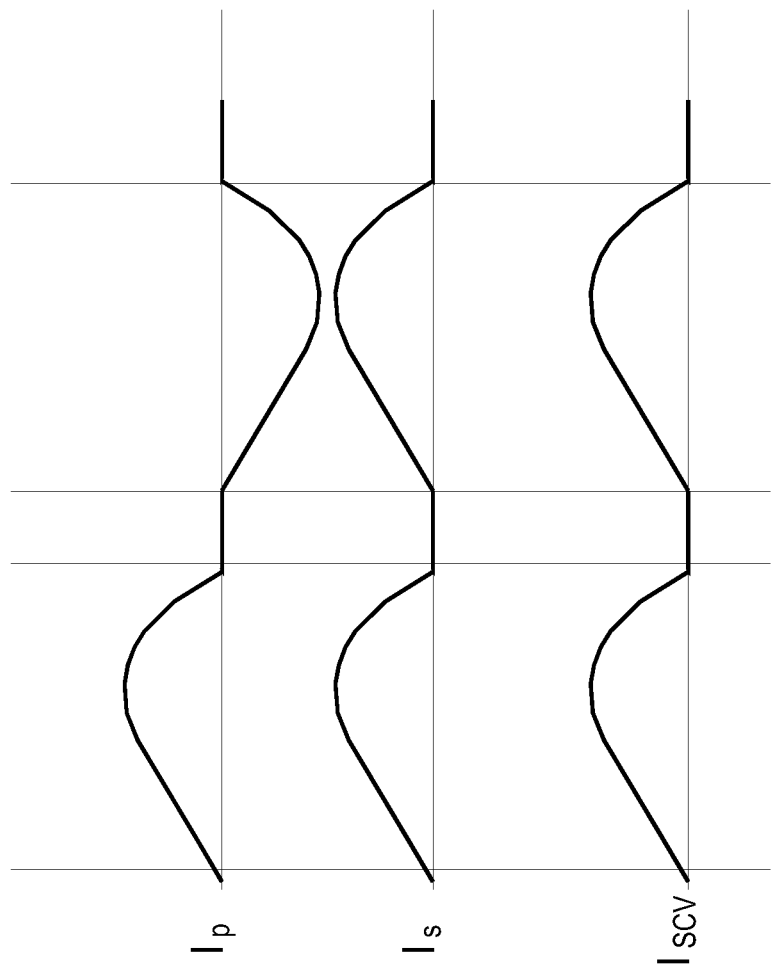

CURRENT SENSING SIGNAL COMPARING DEVICE, AND CURRENT SENSING SIGNAL COMPARING METHOD

CROSS-REFERENCE TO RELATED APPLICATION

This application claims the benefit of U.S. Provisional Application No. 61/256,646, filed on Oct. 30, 2009, and entitled "VARIABLE RESISTOR SENSING METHOD", the entirety of which is hereby incorporated by reference.

FIELD OF THE INVENTION

The present invention relates to a power converter, and more particularly to a current sensing mechanism and a current sensing signal comparing mechanism in a power converter.

BACKGROUND OF THE INVENTION

In electronic circuits, current signal is usually taken as the input signal of the control circuitry and protection circuitry. Current signals can allow electric circuits to operate under stable and reliable circumstances. Therefore, in order to grasp the variations of current signals in electric circuits, an accurate current signal sensing technique is necessary to be built to reflect the actual electric currents. Current signals in typical electric circuits include switching current, input current, load current, and so on. Thus far, several current sensing techniques have been directly or indirectly applied to a variety of circuit topologies. FIG. 1 shows a current sensing circuit for sensing a load current and a power converter 100 incorporating such current sensing circuit according to the prior art. It should be noted that similar circuit elements are labeled with the same reference numerals throughout the specification. As shown in FIG. 1, the power converter 100 includes an input capacitor Cin connected to the input terminals of the power converter 100 for removing high-frequency noises from the input voltage Vin. The power converter 100 further includes switches Qa-Qd connected in parallel with the input capacitor Cin. The power converter 100 further includes a transformer T100 and a LLC resonant circuit consisted of a resonant inductor Lr, a resonant capacitor Cr, and a resonant inductor Lm, in which the resonant inductor Lm can be the magnetizing inductance of the transformer T100. The LLC resonant circuit (Lr, Cr, Lm) is configured to generate resonance to transfer the energy of the input voltage Vin to the primary side Np100 of the transformer T100 according to the switching operation of the switches Qa-Qd. The transformer T100 is configured to transfer the energy at its primary side Np100 to its secondary side Ns100 according to the switching operation of the switches Qa-Qd, thereby inducing an AC current across its secondary side Ns 100. The induced AC current is rectified by the synchronous rectifier (SR1,SR2) located at the secondary side Ns100 of the transformer T100 into a full-wave rectified DC current, thereby generating an output DC voltage Vo across the output capacitor Co to power a load $R_L$. In addition, a current sensing resistor Rs is placed at the secondary side Ns100 of the transformer T100 and the output side of the synchronous rectifier (SR1, SR2) for sensing the load current Io of the power converter 100. The current flowing through the current sensing resistor Rs denotes the actual load current. The current sensing technique revealed in FIG. 1 is advantageous in terms of simple circuit structure and the steadiness of current sensing accuracy without being affected by the parasitic parameter by the converter 100. Nonetheless, the large load current flowing through the current sensing resistor Rs will cause considerable power loss, which in turn results in low power conversion efficiency. Besides, the heat generated as a result of the large load current flowing through the current sensing resistor Rs is difficult to dissipate. It should be noted that the output voltage Vo developed across the output capacitor Co is constant, and thus the average current flowing through the output capacitor Co is zero. Therefore, the average value of the secondary current Is of the power converter 100 is equal to the load current Io, i.e. the output current of the power converter 100. It should be noted that the switching control circuit which is used to control the switching of the switches Qa-Qd is not shown in the power converter 100 of FIG. 1 for simplicity.

FIG. 2 shows another kind of current sensing circuit for sensing a load current and a power converter 200 incorporating such current sensing circuit according to the prior art. In FIG. 2, a current transformer CT has a primary winding CTNP connected to the output capacitor Co and a secondary winding CTNS. The current transformer CT is placed between the secondary side Ns100 of the transformer T100 and the output capacitor Co, or placed between the output terminal of the synchronous rectifier (SR1, SR2) and the output capacitor Co. The load current Io flows through the primary winding CTNP of the current transformer CT and a proportional current is induced across the secondary winding CTNS of the current transformer CT. The proportional current is rectified by the diode rectifier DR200 connected to the secondary winding CTNS of the current transformer CT, thereby generating a current sensing signal by the current sensing resistor Rs connected to the diode rectifier DR200. However, it is well known the current transformer CT is a magnet element and the load current Io is relatively large. The large load current flowing through the primary winding CTNP of the current transformer CT will cause considerable coil loss, thereby lowering the power conversion efficiency. It should be noted that the switching control circuit which is used to control the switching of the switches Qa-Qd is not shown in the power converter 200 of FIG. 2 for simplicity.

FIG. 3 shows another kind of current sensing circuit for sensing a load current and a power converter 300 incorporating such current sensing circuit according to the prior art. In FIG. 3, a current transformer CT is placed at the primary side Np100 of the transformer T100, and has a primary winding CTNP connected between the resonant inductor Lm of the LLC resonant circuit (Lr, Cr, Lm) and the primary winding Np100 of the transformer T100 and a secondary winding CTNS. Because the primary current Ip is proportional to the secondary current Is of the power converter 300 and the proportion between the primary current Ip and the secondary current Is depends on the turn ratio of the transformer T100, the load current can be sensed by sensing the primary current Ip. In addition, a synchronous rectifier SR is connected to the secondary winding CTNS of the current transformer CT for synchronously rectifying the current induced across the secondary winding CTNS of the current transformer CT. Also, a current sensing resistor Rs is connected to the synchronous rectifier SR to generate a current sensing signal. It should be noted that the switching control circuit which is used to control the switching of the switches Qa-Qd is not shown in the power converter 300 of FIG. 3 for simplicity. If the power converter 300 is a buck converter, the primary current Ip is definitely lower than the secondary current Is. Therefore, the coil loss incurred by the current transformer CT will be greatly reduced. However, the current transformer CT is used for signal conversion only, and the synchronous rectifier SR is used to perform accurate synchronous rectification to the current sensing signal according to different load current waveforms. The gate driving signal of the synchronous rectifier SR is generated by the load current waveform, and thus the synchronous rectifier SR of FIG. 3 requires a set of complicated gate driving signal generating circuit as a driver. In this manner, the current sensing circuit of FIG. 3 will complicate the circuit design and lower the reliability, and further increase the manufacturing cost.

There is a tendency to develop a current sensing technique and a current sensing signal comparing technique for accurately sensing the current signal of a power converter and applying the result of sensing to regulate or protect the power converter. Or otherwise, the result of sensing can be reported to the power converter.

SUMMARY OF THE INVENTION

An object of the invention is to provide a current sensing technique and a current sensing signal comparing technique that may sense the current signal of a power converter with accuracy by means of signal compensation, and thereby regulating or protecting the power converter according to the result of sensing. Or otherwise, the result of sensing can be reported to the power converter.

To this end, the invention proposes a current sensing device and a current sensing signal comparing device, in which the current sensing device includes a current sensing circuit for sensing a current signal of a switching circuit and generating a current sensing signal accordingly, a control unit for outputting a control signal, and an offsetting circuit for compensating the current sensing signal according to the control signal. On the other hand, the inventive current sensing signal comparing device includes a current sensing circuit for sensing a current signal of the switching circuit and outputting a current sensing signal accordingly, a control unit for outputting a control signal, an offsetting circuit connected to the control unit, wherein the offsetting circuit is configured to compensate a first signal selected from a group consisting of the current sensing signal and a constant current reference signal to generate a second signal, and a constant current compare unit having a first input terminal receiving the second signal and having a second input terminal receiving a third signal selected from the group consisting of the current sensing signal and a constant current reference signal which is different from first signal to generate a constant current control signal.

Now the foregoing and other features and advantages of the present invention will be best understood through the following descriptions with reference to the accompanying drawings, wherein:

BRIEF DESCRIPTION OF THE DRAWINGS

FIG. 7 shows the current waveforms of the primary current Ip, the secondary current Is, and the sensed current Iscv as the switching frequency fs is lower than the resonant frequency of the power converter;

DESCRIPTION OF THE PREFERRED EMBODIMENT

Several preferred embodiments embodying the features and advantages of the invention will be expounded in following paragraphs of descriptions. It is to be realized that the present invention is allowed to have various modification in different respects, all of which are without departing from the scope of the present invention, and the description herein and the drawings are to be taken as illustrative in nature, but not to be taken as a confinement for the invention.

Figure 1:
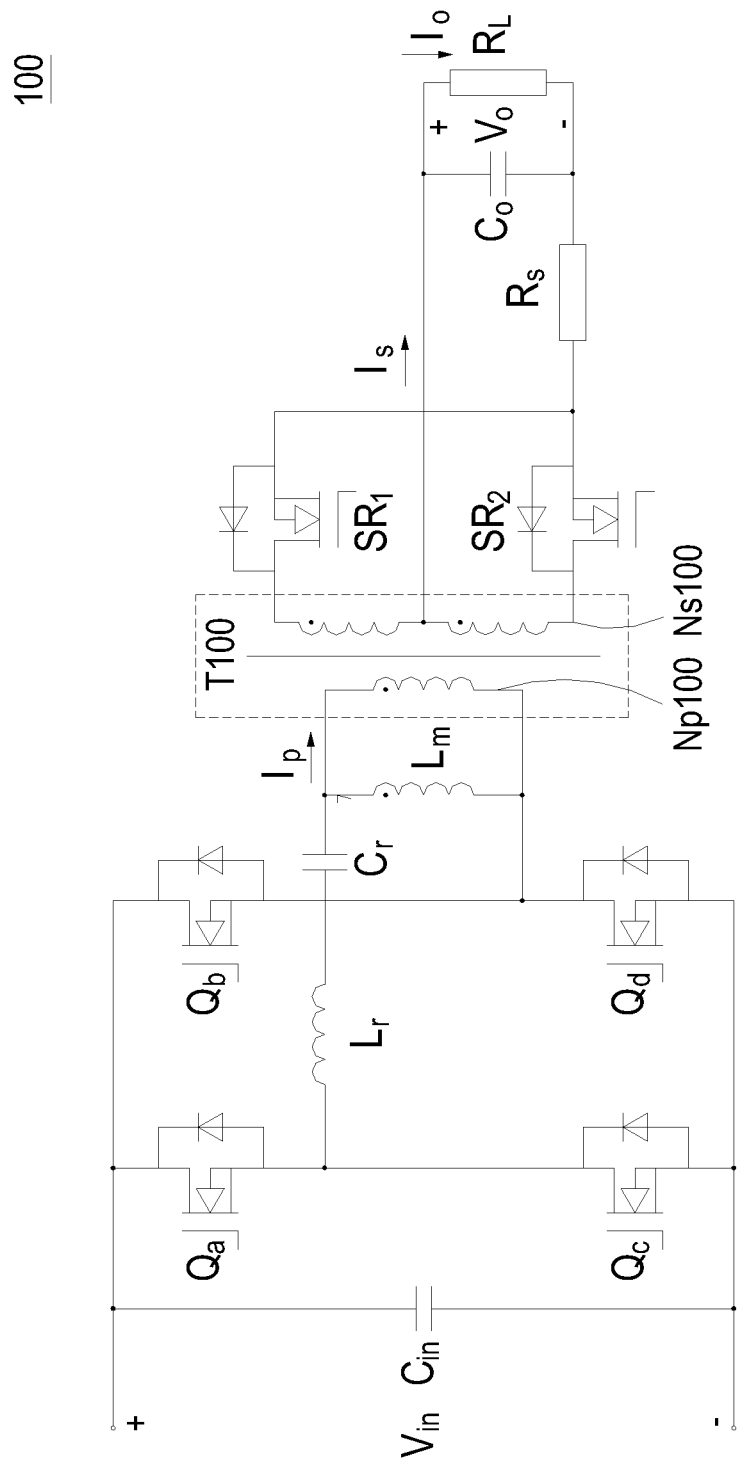
FIG. 1 shows a current sensing circuit for sensing a load current and a power converter incorporating such current sensing circuit according to the prior art.
Figure 2:
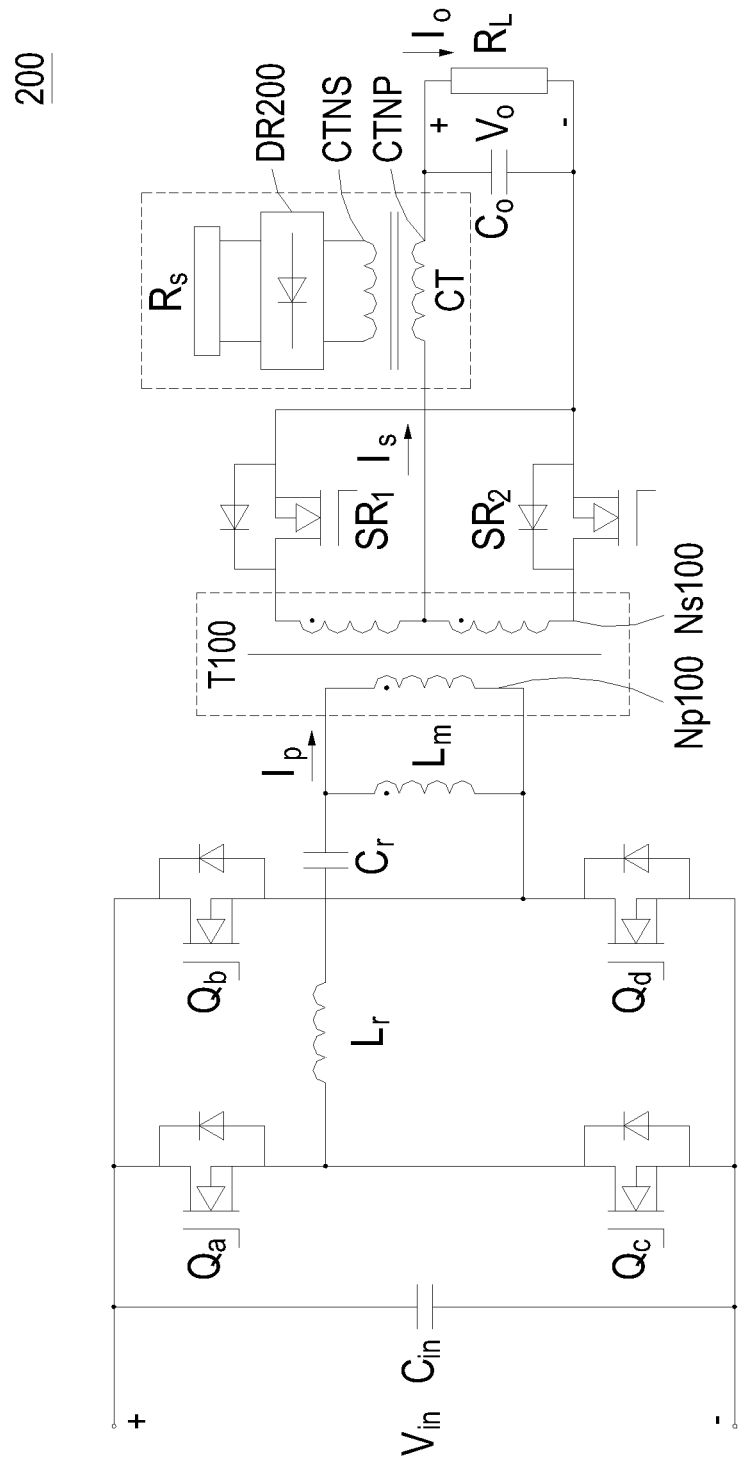
FIG. 2 shows another kind of current sensing circuit for sensing a load current and a power converter incorporating such current sensing circuit according to the prior art.
Figure 3:
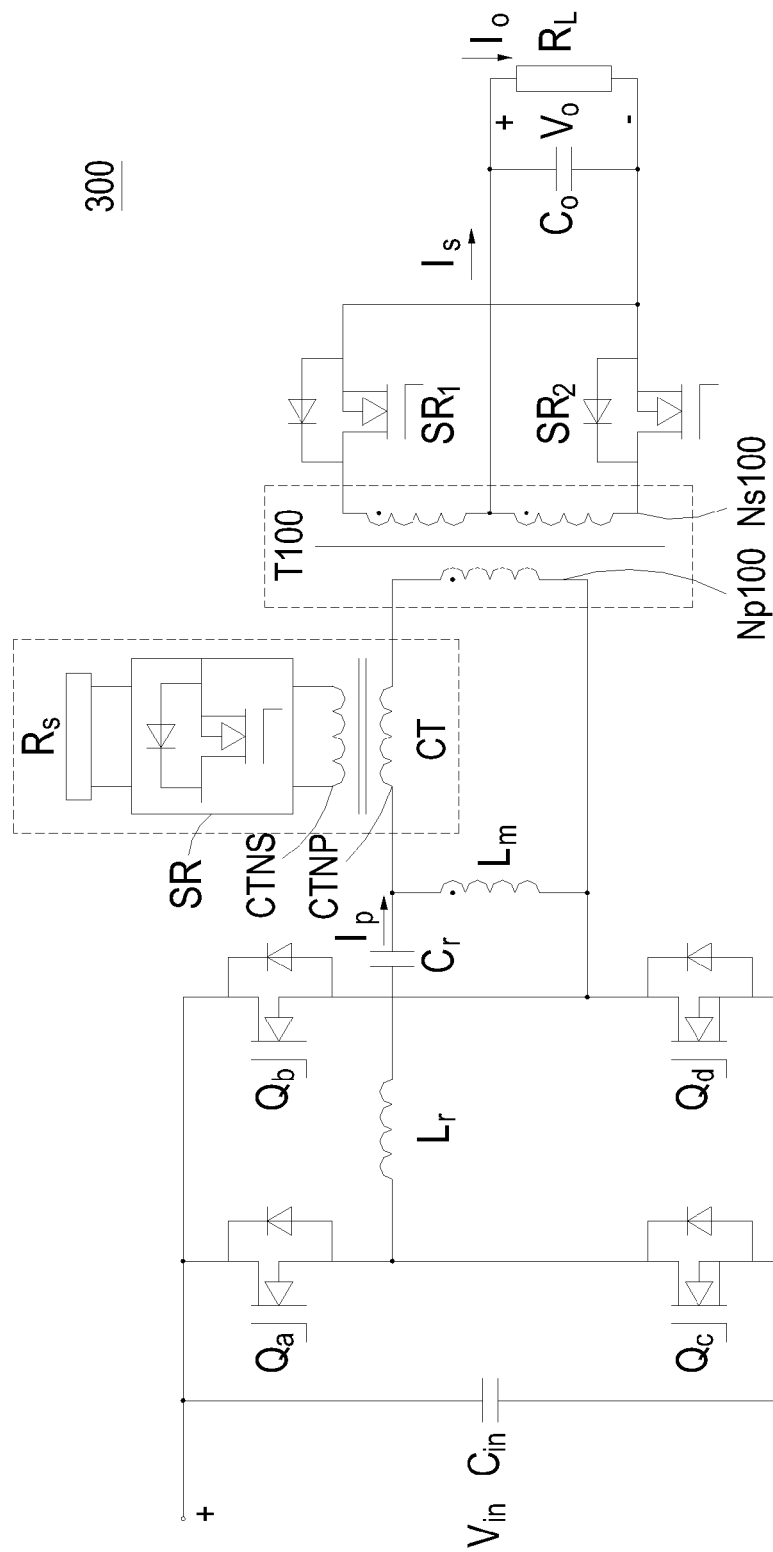
FIG. 3 shows another kind of current sensing circuit for sensing a load current and a power converter incorporating such current sensing circuit according to the prior art.
Figure 4:
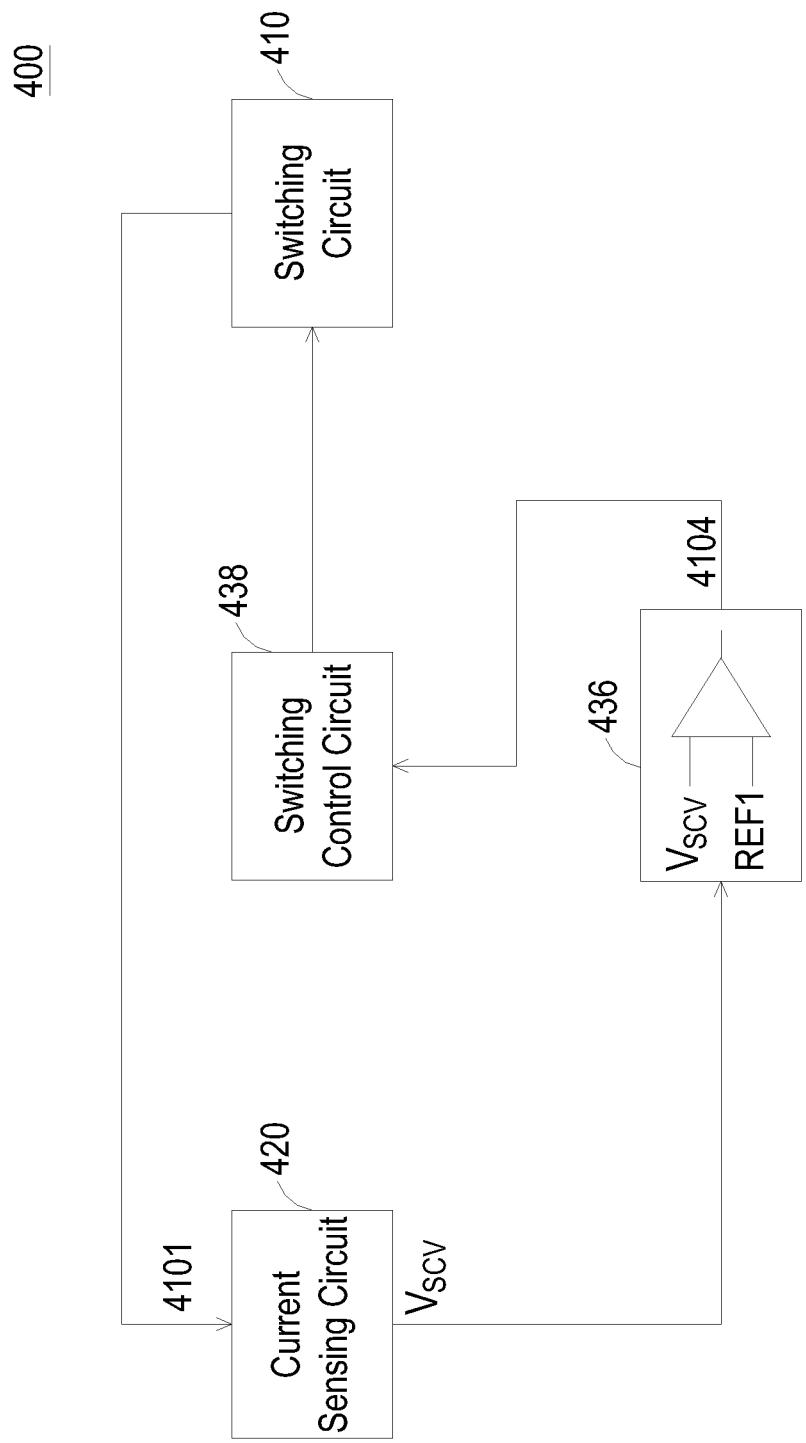
FIG. 4 shows an overall systematic block diagram of the current sensing circuit according to the prior art.
Figure 5A:
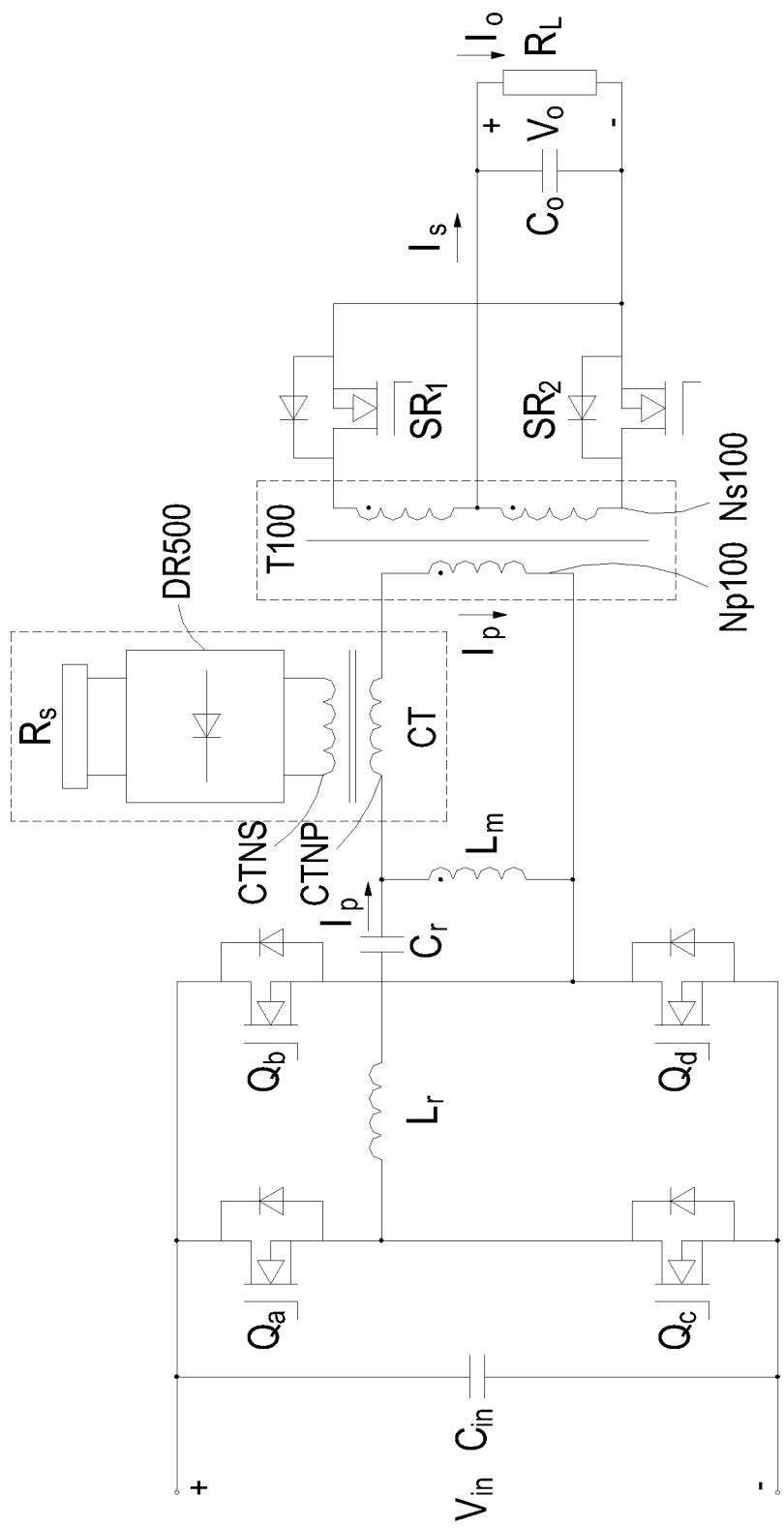
FIG. 5(A) shows the partial topology of the current sensing circuit and the topology of the switching circuit 410 of FIG. 4.

FIG. 4 shows an overall systematic block diagram of the current sensing circuit according to the prior art. As indicated in FIG. 4, a power converter 400 includes a switching circuit 410, which is preferably a full-bridge LLC resonant converter, as shown in FIG. 5(A). However, the configuration of the switching circuit 410 is not limited to the form precisely disclosed herein, but can be exemplified by any kinds of converter topologies. The power converter 400 further includes a current sensing circuit 420, a switching control circuit 438, and a constant current compare unit 436. The current sensing circuit 420 is configured to receive a current signal 4101 from the switching circuit 410 for sensing the load current (output current) of the power converter 400 and outputting a current sensing signal Vscv accordingly. The constant current compare unit 436 is configured to receive and process the current sensing signal Vscv and thereby outputting a constant current control signal 4104 to the switching control circuit 438, so as to drive the switching control circuit 438 to enable the switching circuit 410 to output a constant current. The current sensing signal Vscv is transmitted to the constant current compare unit 436 to be compared with a constant current reference signal REF1. The constant current reference signal REF1 is proportional to the practical control parameters defined by the specifications of the power converter 400. By comparing the current sensing signal Vscv with the constant current reference signal REF1, the constant current compare unit 436 is able to output the constant current control signal 4104 to the switching control circuit 438 in response to the comparison results. The switching control circuit 438 is configured to regulate the switching operation of the switching circuit 410 according to the constant current control signal 4104, thereby regulating the output current of the power converter 400 to be at a constant level.

Figure 5B:
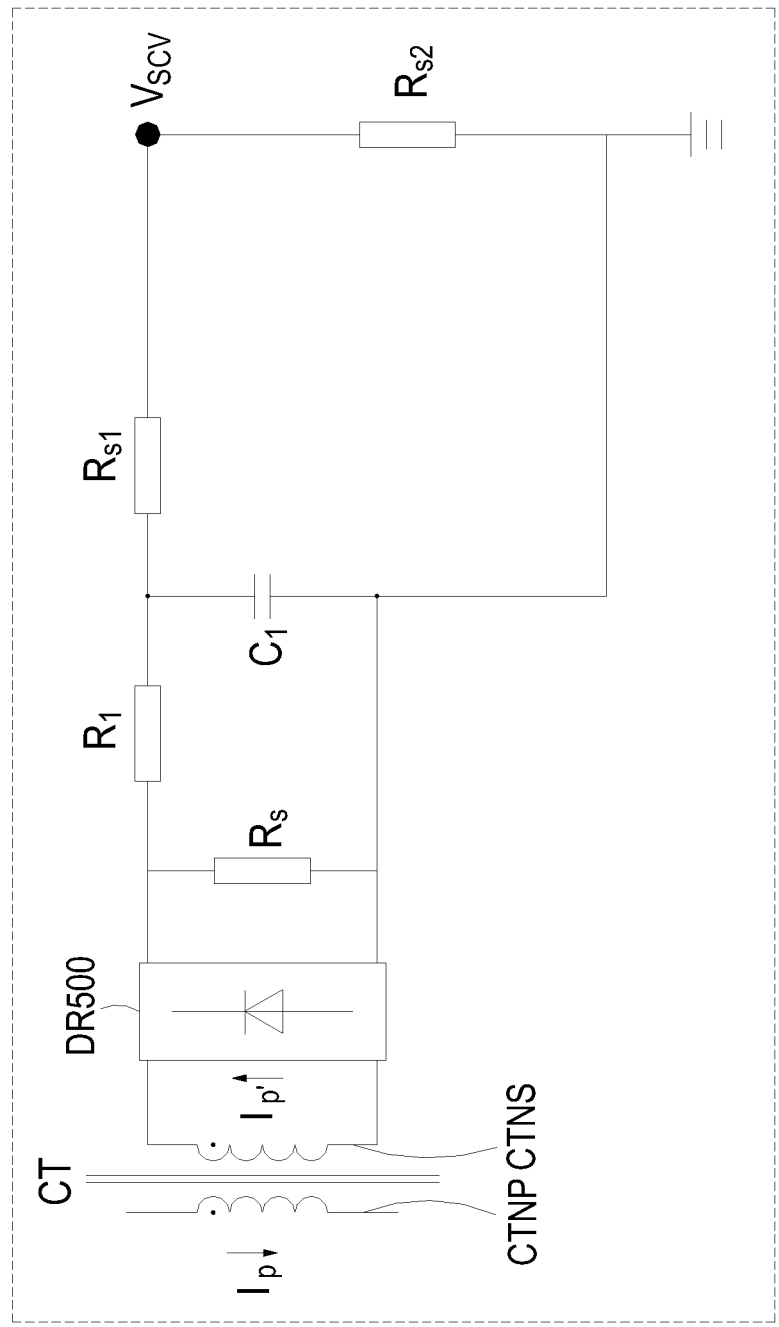
FIG. 5(B) shows the detailed circuitry of the current sensing circuit of FIG. 5(A)

Referring to FIG. 5(A) and FIG. 5(B), in which FIG. 5(A) shows the partial topology of the current sensing circuit 420 and the topology of the switching circuit 410 of FIG. 4. As shown in FIG. 5(A), the power converter includes a current sensing circuit including a current transformer CT, a diode rectifier DR500, and a current sensing resistor Rs. The current transformer CT is placed between the primary side Np100 of the transformer T100 and the LLC resonant circuit (Lr, Lm, Cr) and having a primary winding CTNP and a secondary winding CTNS, in which the primary winding CTNP is connected to the primary winding Np100 of the transformer T100 and the LLC resonant circuit (Lr, Lm, Cr) and the secondary winding CTNS is connected in parallel with the diode rectifier DR500. The current sensing resistor Rs is connected in parallel with the diode rectifier DR500. The primary current Ip flows through the primary winding CTNP of the current transformer CT, and thus a current signal Ip' in proportion to the primary current Ip is induced on the secondary winding CTNS of the current transformer CT. The current Ip' induced on the secondary winding CTNS of the current transformer CT is rectified by the diode rectifier DR500 into a rectified DC current, which in turn result in a voltage signal developed across the current sensing resistor Rs. The voltage signal across the current sensing resistor Rs is filtered by the filter (R1, C1), and thereby generating a DC voltage signal, which in turn results in a current sensing signal Vscv by dividing the DC voltage signal outputted from the filter (R1, C1) by the voltage divider (Rs1, Rs2). FIG. 5(B) shows the detailed circuitry of the current sensing circuit 420 of FIG. 4. As shown in FIG. 5(B), the current sensing circuit includes a filter (R1, C1) consisted of a resistor R1 and a capacitor C1 in addition to the current transformer CT, the diode rectifier DR500, and the current sensing resistor Rs. The filter (R1, C1) is connected between the current sensing resistor Rs and the ground terminal. The filter (R1, C1) is configured to remove the high-frequency noise from the voltage signal developed across the current sensing resistor Rs. The current sensing circuit 420 further includes a voltage divider consisted of resistors Rs1 and Rs2 connected to the output terminal of the filter (R1, C1) for dividing the voltage signal outputted from the filter (R1, C1) in order to generate the current sensing signal Vscv.

Figure 6A:
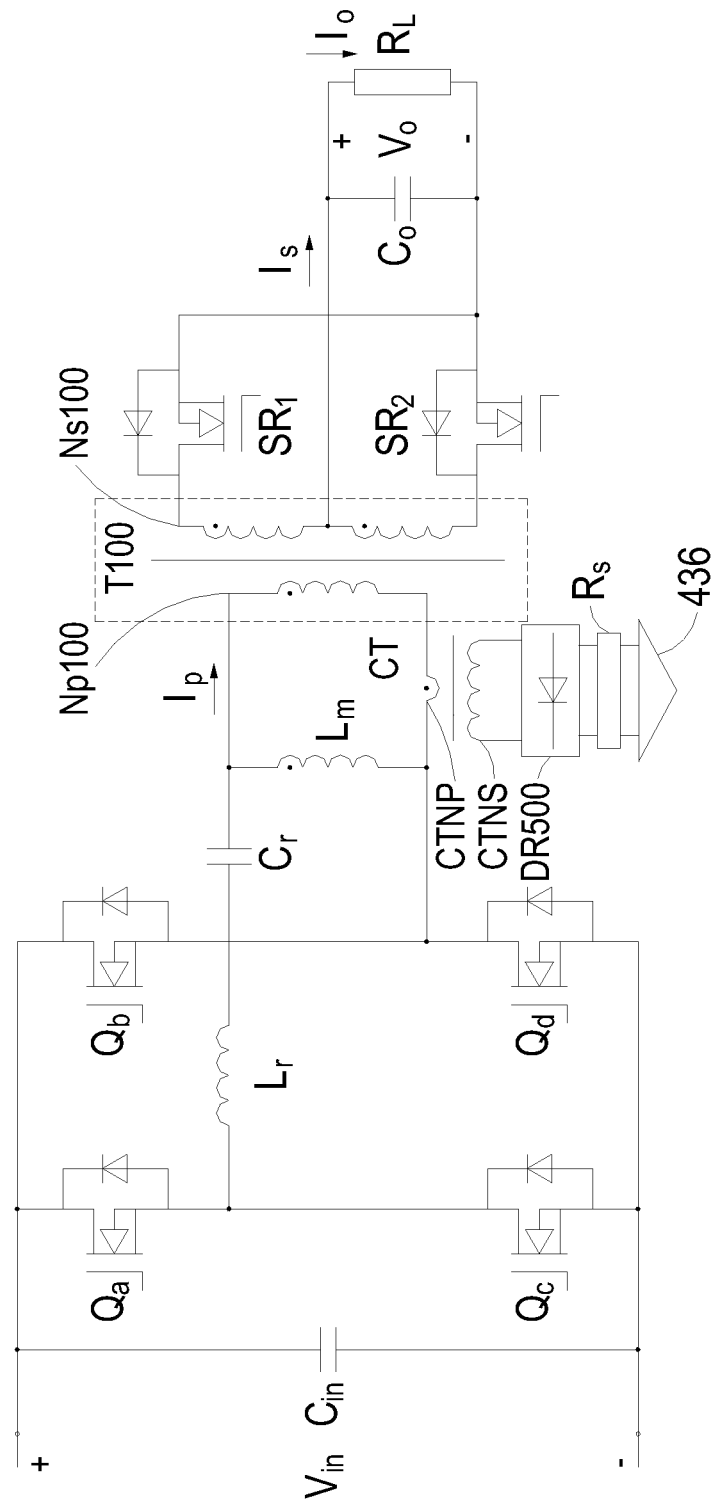
FIG. 6(A) shows the partial topology of the current sensing circuit of FIG. 4 and the topology of the constant current compare unit and the switching circuit of FIG. 4.
Figure 6B:
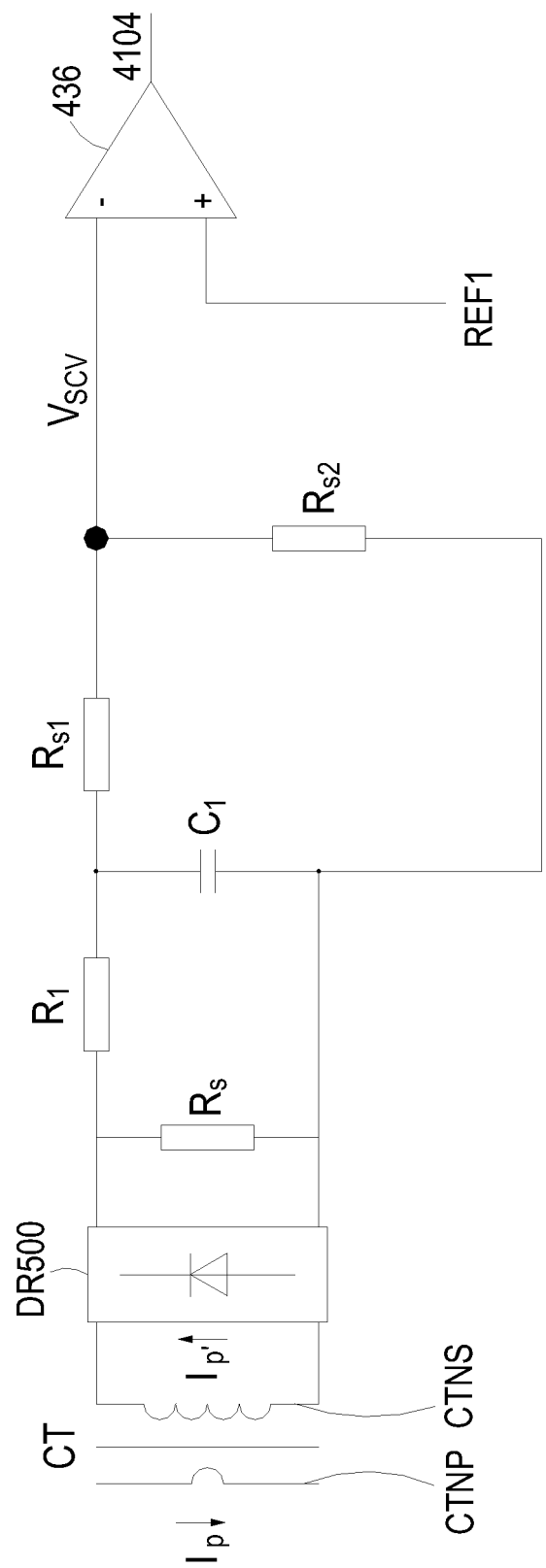
FIG. 6(B) shows the detailed circuitry of the current sensing circuit and constant current compare unit of FIG. 6(A)

FIG. 6(A) shows the partial topology of the current sensing circuit 420 of FIG. 4 and the topology of the constant current compare unit 436 and the switching circuit 410 of FIG. 4. As shown in FIG. 6(A), the current sensing circuit including the current transformer CT, the diode rectifier DR500, and the current sensing resistor Rs are connected to the primary side Np100 of the transformer T100, as shown in FIG. 5(A). In addition, FIG. 6 adds a constant current compare unit 436 which is connected to the current sensing resistor Rs. FIG. 6(B) shows the detailed circuitry of the current sensing circuit 420 and the constant current compare unit 436. Compared to FIG. 5(B), the circuitry of FIG. 6(B) additionally includes a constant current compare unit 436 to compare the current sensing signal Vscv and a constant current reference signal REF1 in order to generate a constant current control signal 4104 according to the comparison result.

Figure 8:
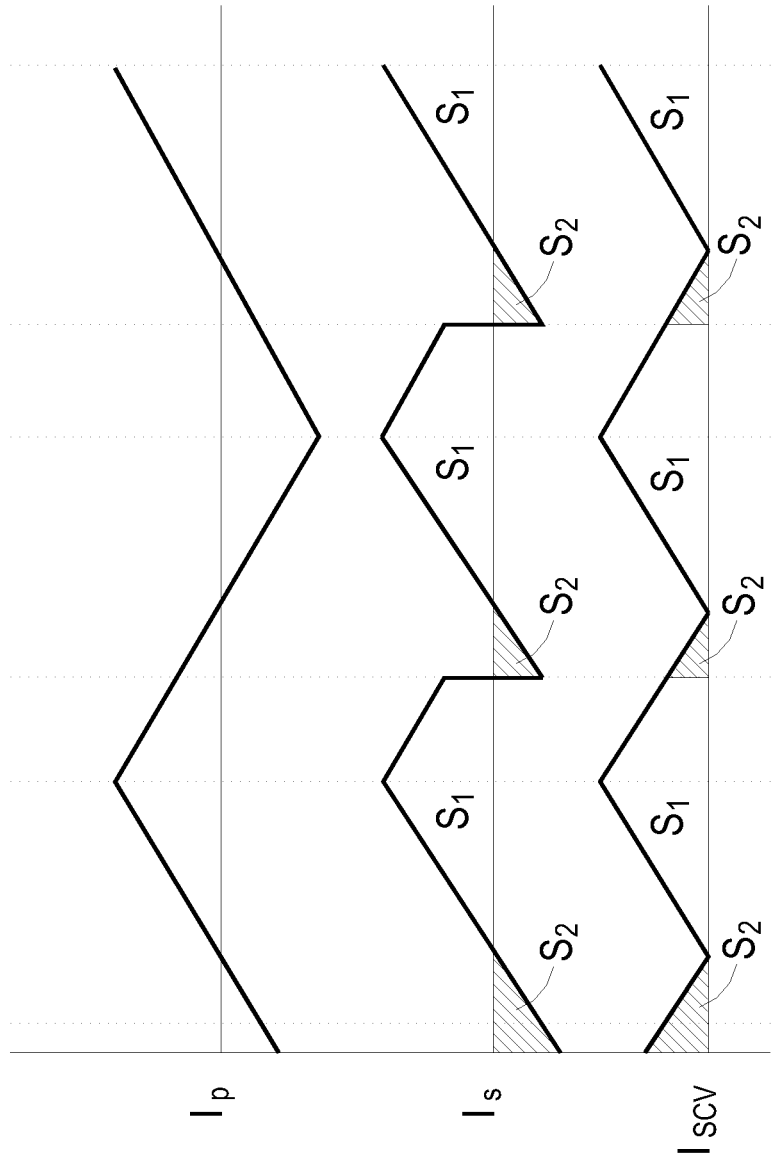
FIG. 8 shows the current waveforms of the primary current Ip, the secondary current Is, and the sensed current Iscv as the switching frequency fs is higher than the resonant frequency of the power converter.

FIG. 7 shows the current waveforms of the primary current Ip, the secondary current Is, and the sensed current Iscv as the switching frequency fs is lower than the resonant frequency fo of the power converter 400, in which the sensed current Iscv is the current waveform of the current sensing signal Vscv. As shown in FIG. 7, as that the switching frequency fs is lower than the resonant frequency fo of the power converter 400, the waveform of the sensed current Iscv conforms with the waveform of the secondary current Is. Under this condition, the current sensing signal Vscv is eligible to represent the actual load current (output current) of the power converter 400. FIG. 8 shows the current waveforms of the primary current Ip, the secondary current Is, and the sensed current Iscv as the switching frequency fs is higher than the resonant frequency fo of the power converter 400. In FIG. 8, the average value of the current signal can be represented by the area of the waveform section in a half-wave period. As shown, the average value of the secondary current Is contains the area of the waveform section S1 minus the area of the waveform section S2, while the average value of the sensed current Iscv contains the area of the waveform section 51 plus the area of the waveform section S2. As a result, the average value of the secondary current Is does not conform with the average value of the sensed current Iscv. Therefore, under the high-frequency switching circumstances, for example, as the switching frequency fs is higher than the resonant frequency fo, the current sensing signal Vscv is ineligible to accurately represent the actual output current of the power converter 400, resulting in sensing error. Because the switching current is proportional with the secondary current Is, the average output current Io can also be obtained by sensing the current of the switched Qa-Qd. According to the above analysis, for the characteristic of diode positive rectifying capacity, as the switching frequency fs is higher than the resonant frequency fo, the current sensing signal Vscv is ineligible to accurately represent the actual output current of the power converter 400, resulting in sensing error.

Figure 9:
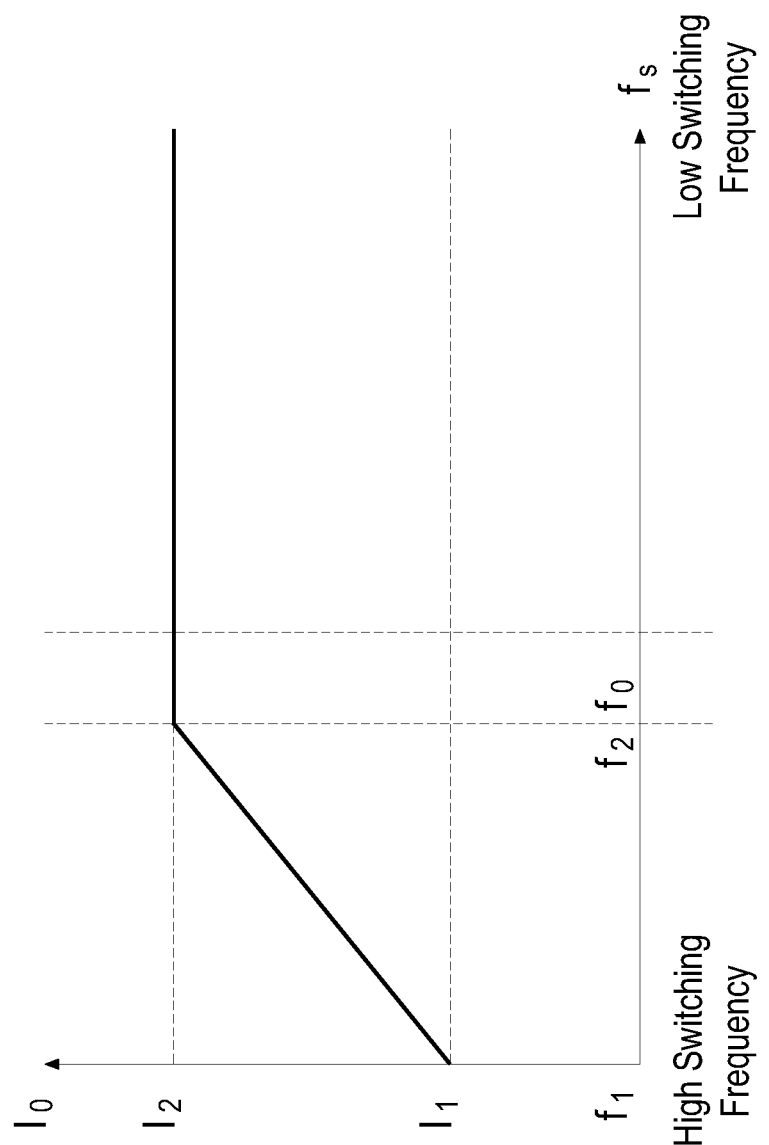
FIG. 9 shows the characteristic curve between the output current Io and the switching frequency fs according to the prior art.

FIG. 9 shows the characteristic curve between the output current Io and the switching frequency fs, in which the magnitude of the switching frequency fs decreases progressively along the positive direction of the horizontal axis. It should be noted that the output current Io, i.e. the load current, is the average value of the secondary current Is. When the switching frequency fs is lower than the frequency f2, in which the frequency f2 is close to the resonant frequency fo but higher than the resonant frequency fo, the average value of the secondary current Is conforms with the sensed current Iscv. Hence, the current sensing signal Vscv is eligible to accurately represent the output current Io of the power converter 400, as shown in FIG. 7. Under this condition, the output current Io of the power converter 400 is maintained at a constant level of I2. When the switching frequency fs is higher than the frequency f2, the average value of the secondary current Is does not conform with the sensed current Iscv. As shown in FIG. 8, the average value of the sensed current Iscv is different from the average value of the secondary current Is in terms of the area of the waveform section S2. Under this condition, the average value of the sensed current Iscv will be higher than the average value of the secondary current Is. In other words, the sensed current Iscv will be higher than the output current Io of the power converter 400. As the sensed current Iscv is higher than the output current Io of the power converter 400, the switching control circuit 438 (shown in FIG. 4) drive the output current Io of the power converter 400 to slide down due to the rise of the current sensing signal Vscv. With the increase of the switching frequency fs, the area of the waveform section S2 shown in FIG. 8 increases as well, which in turn causes the difference between the average value of the sensed current Iscv and the average value of the secondary current Is to become larger and larger. Therefore, the sensed current will be going up with the rise of the switching frequency fs, while the output current Io of the power converter 400 will be going down with the rise of the switching frequency fs. When the switching frequency fs goes up to f1, the output current Io of the power converter 400 will go down to I1. In the meantime, the sensing error will reach its maximum at I2-I1. Hence, the higher the switching frequency fs is, the larger the sensing error will be.

Figure 10:
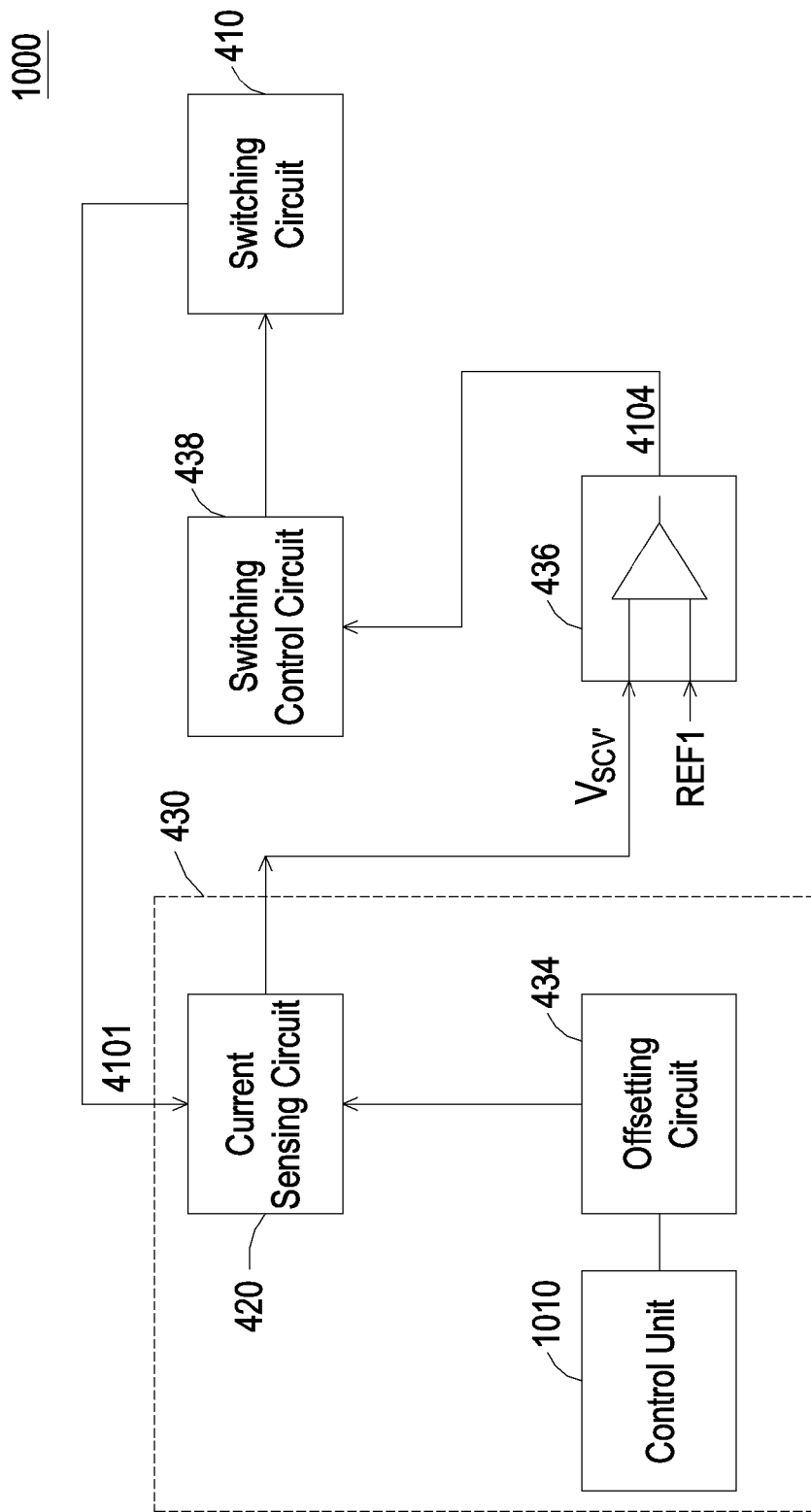
FIG. 10 shows an overall block diagram of the current sensing device according to a first embodiment of the invention.

The invention proposes a current sensing device and current sensing method, and a current sensing signal comparing device and current sensing signal comparing method. FIG. 10 shows an overall block diagram of the current sensing device according to a first embodiment of the invention. As shown in FIG. 10, a power converter 1000 includes a switching circuit 410 which is preferably implemented by a full-bridge LLC resonant converter, as shown in FIG. 5(A). However, the topology of the switching circuit 410 may have various modifications and derivations, and is not limited to the previse form disclosed herein. The power converter 1000 further includes a current sensing device 430, a switching control circuit 438, and a constant current compare unit 436. The current sensing device is configured to receive a current signal 4101 from the switching circuit 410 for sensing the load current (output current) of the power converter 1000 in order to generate a current sensing signal Vscv accordingly, and compensating the sensing error of the current sensing signal in order to generate a compensated current sensing signal Vscv'. The constant current compare unit 436 is configured to receive and process the compensated current sensing signal Vscv' in order to output a constant current control signal to the switching control circuit 438 to drive the switching control circuit 438 to manipulate the switching circuit 410 to output a constant current. The current sensing device 430 includes a current sensing circuit 420 for sensing the current signal 4101 which may be the load current (output current) of the power converter 1000 and generating a current sensing signal Vscv accordingly. The current sensing device 430 further includes a control circuit 1010 and an offsetting device 434. The offsetting device 434 is configured to be manipulated by a control signal issued by the control unit that represents the relationship between the switching frequency of the switching circuit 410 and a predetermined frequency or the relationship between the output voltage of the switching circuit 410 and a predetermined voltage, in order to compensate the current sensing signal Vscv to compensate the sensing error as a result of circuit parameters, current sensing methodology or other factors, thereby generating a compensated current sensing signal Vscv'. The compensated current sensing signal Vscv' reduces the sensing error of the current sensing signal Vscv generated by the current sensing circuit 420. The compensated current sensing signal Vscv' is transmitted to the constant current compare unit 436 for being compared with a constant current reference signal REF1. The constant current reference signal REF1 is proportional to the actual control parameters defined by the specification of the power converter 1000. By comparing the compensated current sensing signal Vscv' and the constant current reference signal REF1, the constant current compare unit 436 can issue the constant current control signal 4104 to the switching control circuit 438 according to the comparison result. The switching control circuit 438 is configured to regulate the switching operation of the switching circuit 410 according to the constant current control signal 4104, thereby maintaining the output current of the power converter 1000 at a constant level.

Figure 11A:
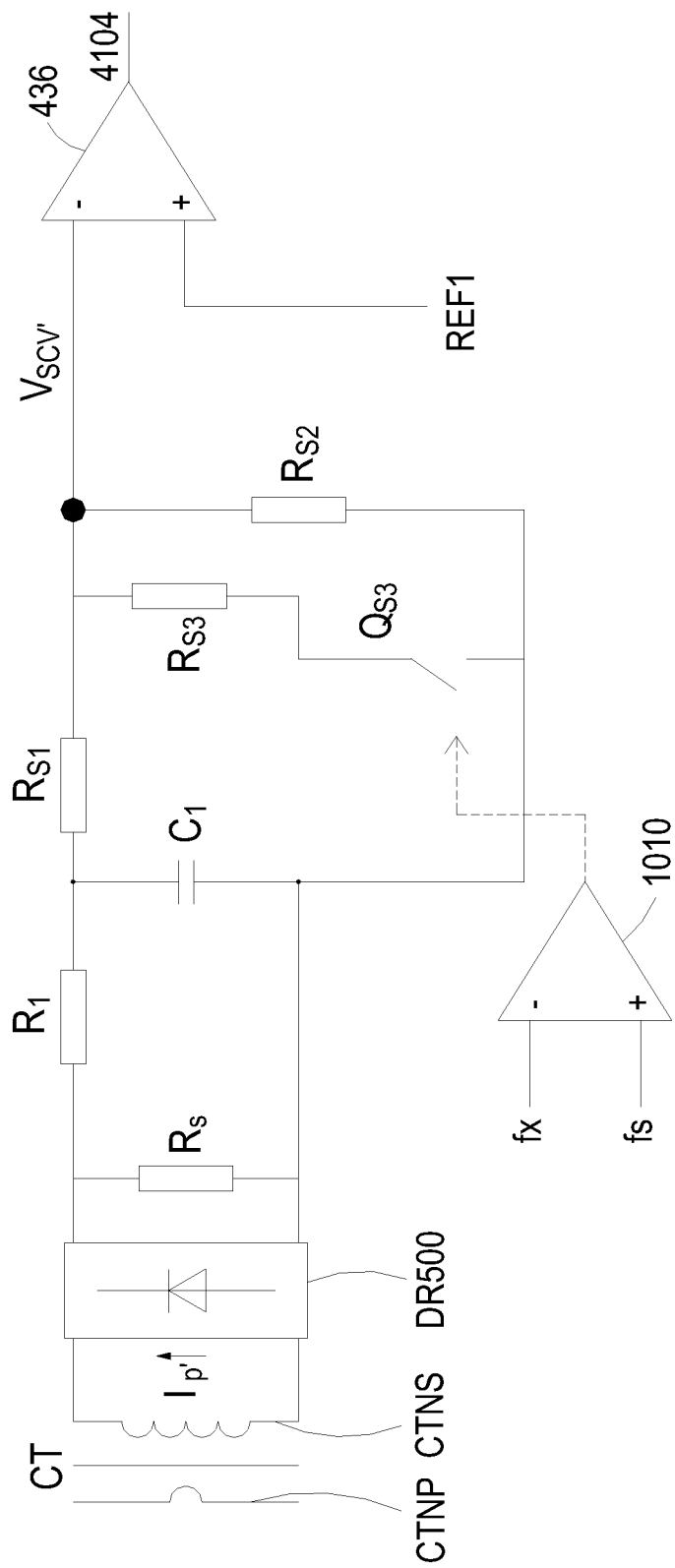
FIG. 11(A) and FIG. 11(C) respectively show the detailed circuitry of the current sensing device and the constant current compare unit of FIG. 10, and the characteristic curve chart showing the characteristic curve between the output current Io and the switching frequency fs as the circuitry of FIG. 11(A) is applied to change the minimum output current.
Figure 11B:
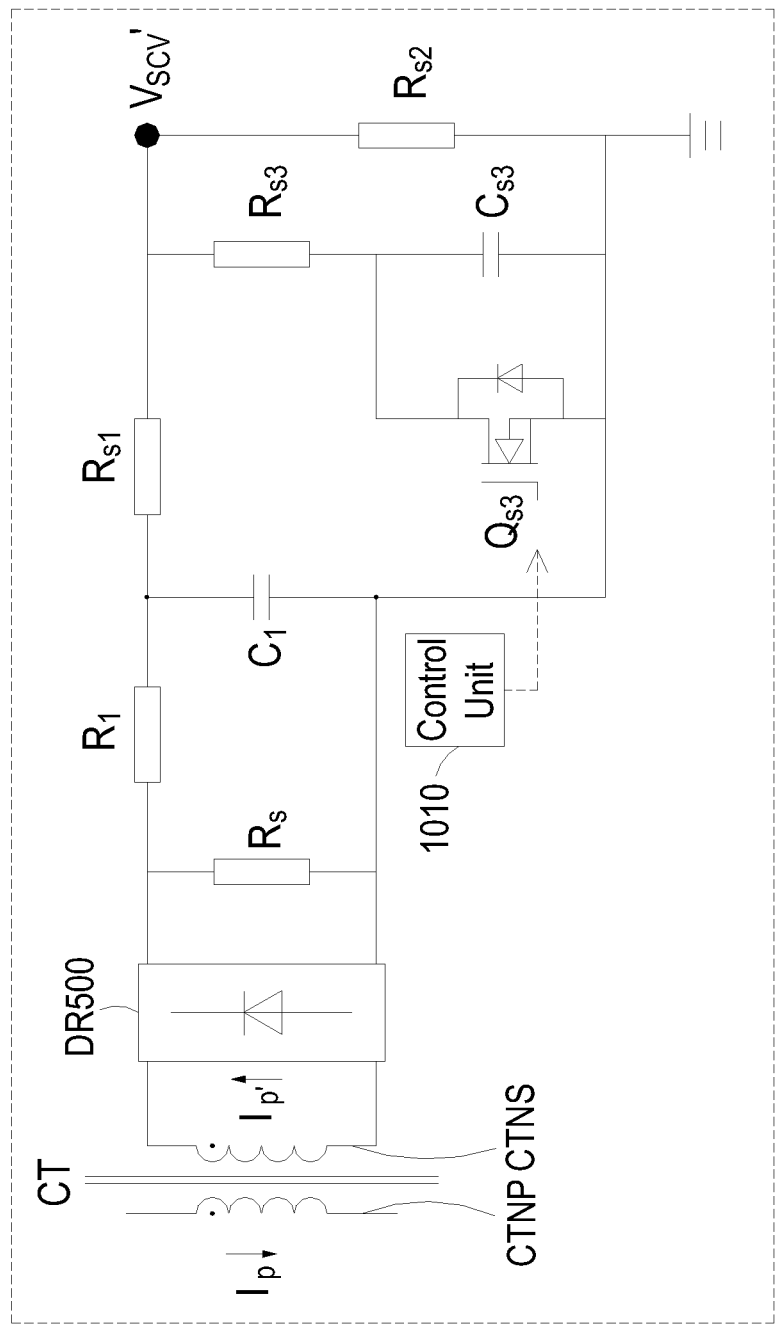
FIG. 11(B) shows a modification of the circuitry of FIG. 11(A)
Figure 11C:
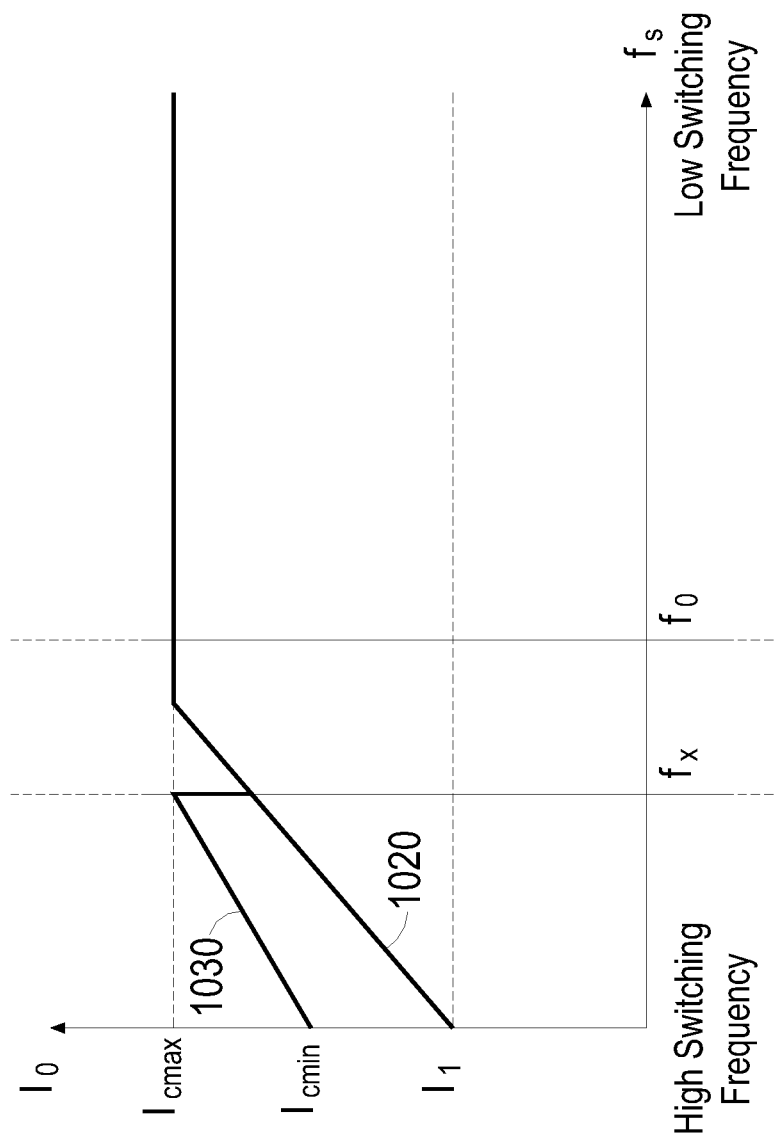

FIG. 11 (A) and FIG. 11(C) respectively show the detailed circuitry of the current sensing device 430 and the constant current compare unit 436 of FIG. 10, and the characteristic curve chart showing the characteristic curve between the output current Io and the switching frequency fs as the circuitry of FIG. 11(A) is applied to change the minimum output current. In FIG. 11(C), the characteristic curve 1020 denotes the relationship between the output current Io and the switching frequency fs as the offsetting circuit is not applied to compensate the current sensing signal, as is the case with the characteristic curve of FIG. 9. The characteristic curve 1030 of FIG. 11(C) denotes the relationship between the output current Io and the switching frequency fs as the offsetting circuit of FIG. 11(A) is applied to change the minimum output current. As indicated by the characteristic curve 1020, if the offsetting circuit 434 is not applied to compensate the current sensing signal Vscv, the current sensing signal Vscv can be calculated by the following equation:

$$Vscv = Ip' \times Rs \times Rs2/(Rs1+Rs2) \quad \text{(equation 1)}$$

Where the maximum sensing error is Icmax-I1, the minimum output current I1 is lower than the specified minimum constant output current Icmin, and Icmax is the specified maximum constant output current. Because the minimum output current I1 is lower than the specified minimum constant output current Icmin, the circuitry of FIG. 6(B) can not meet the specification. In order to allow the output current to be dispersed in the range of Icmax-Icmin to meet the specification, the circuitry of FIG. 11(A) includes an offsetting circuit consisted of a resistor Rs3 and a control switch Qs3. The control unit 1010 may be implemented by a compare unit, as shown in FIG. 11(A), which has a non-inverting input terminal for receiving the switching frequency fs and an inverting input terminal for receiving a predetermined frequency fx. The control unit 1010 of FIG. 11 (A) is configured to compare the switching frequency fs and the predetermined frequency fx. The offsetting circuit is connected to one of the resistor of the divider in parallel and the resistor Rs3 is selectively attached to the voltage divider (Rs1, Rs2) by the control switch Qs3. The first current-conducting terminal of the control switch Qs3 is connected to the resistor Rs3. The second current-conducting terminal of the control switch Qs3 is connected to the ground terminal and the control terminal of the control switch Qs3 is connected to the control unit 1010. The control unit 1010 is configured to manipulate the control switch Qs3 to turn off as the switching frequency fs is lower than the predetermined frequency fx, such that the resistor Rs3 is detached from the voltage divider consisted of resistors Rs1 and Rs2, in which the predetermined frequency fx is higher than the resonant frequency fo. The control unit 1010 is configured to manipulate the control switch Qs3 to turn on as the switching frequency fs is higher than the predetermined frequency fx, such that the resistor Rs3 is attached to the voltage divider consisted of resistors Rs1 and Rs2. Hence, as the switching frequency fs is lower than the predetermined frequency fx, the voltage divider is consisted of resistors Rs1 and Rs2. Under this condition, the compensated current sensing signal Vscv' is equivalent to the uncompensated current sensing signal Vscv and can be calculated by the foregoing equation 1. As the switching frequency fs is higher than the predetermined frequency fx, the voltage divider is consisted of resistors Rs 1, Rs2 and Rs3. Under this condition, the compensated current sensing signal Vscv' can be calculated by the following equation:

$$Vscv' = Ip' \times Rs \times (Rs2//Rs3)/(Rs1+(Rs2//Rs3)) \quad \text{(equation 2)}$$

Where (Rs2//Rs3) is the equivalent resistance of the resistors Rs2 and Rs3 being connected in parallel. Hence, as the switching frequency fs is lower than the predetermined frequency fx, the relationship between the output current Io and the switching frequency fs will be similar to the characteristic curve 1020 which overlaps with the characteristic curve 1030 under this condition. As the switching frequency fs is higher than the predetermined frequency fx, the compensated current sensing signal Vscv' will be lower than the uncompensated current sensing signal Vscv as the resistor Rs3 is attached to the voltage divider. Therefore, the minimum output current I1 will rise up to the specified minimum constant output current Icmin, such that the maximum sensing error will be downscaled to Icmax-Icmin, as denoted by the characteristic curve 1030 shown in FIG. 11(C). By employing an offsetting circuit 434 consisted of the resistor Rs3 and the control switch Qs3, the maximum sensing error can be downscaled and the variation of the output current can be confined to the specification. Besides, the control unit 1010 can acquire information associated with the switching frequency of the switching circuit 410 from the switching control circuit 438. Alternatively, the offsetting circuit 434 may include two or more resistors and control switches, and its internal configuration can be designed arbitrarily depending on the design choices without being limited to the precise forms disclosed herein.

FIG. 11(B) shows a modification of the circuitry of FIG. 11(A). It should be noted that the control unit 1010 of FIG. 11(B) is the same circuit element with the control unit 101 of FIG. 11(A). However, the control unit 1010 of FIG. 11(B) is denoted by a circuit block instead of a circuit symbol. Compared to FIG. 11(A), the circuitry adds a capacitor Cs3 connected in parallel with the control switch Qs3. Capacitor Cs3 and the resistor Rs3 constitute a filter, thereby smoothing the compensated current sensing signal Vscv'. Also, the filtering circuit (Rs3, Cs3) is manipulated by the control unit 1010 to control its charging/discharging operation. Nonetheless, the capacitor Cs3 is an optional element.

Figure 11D:
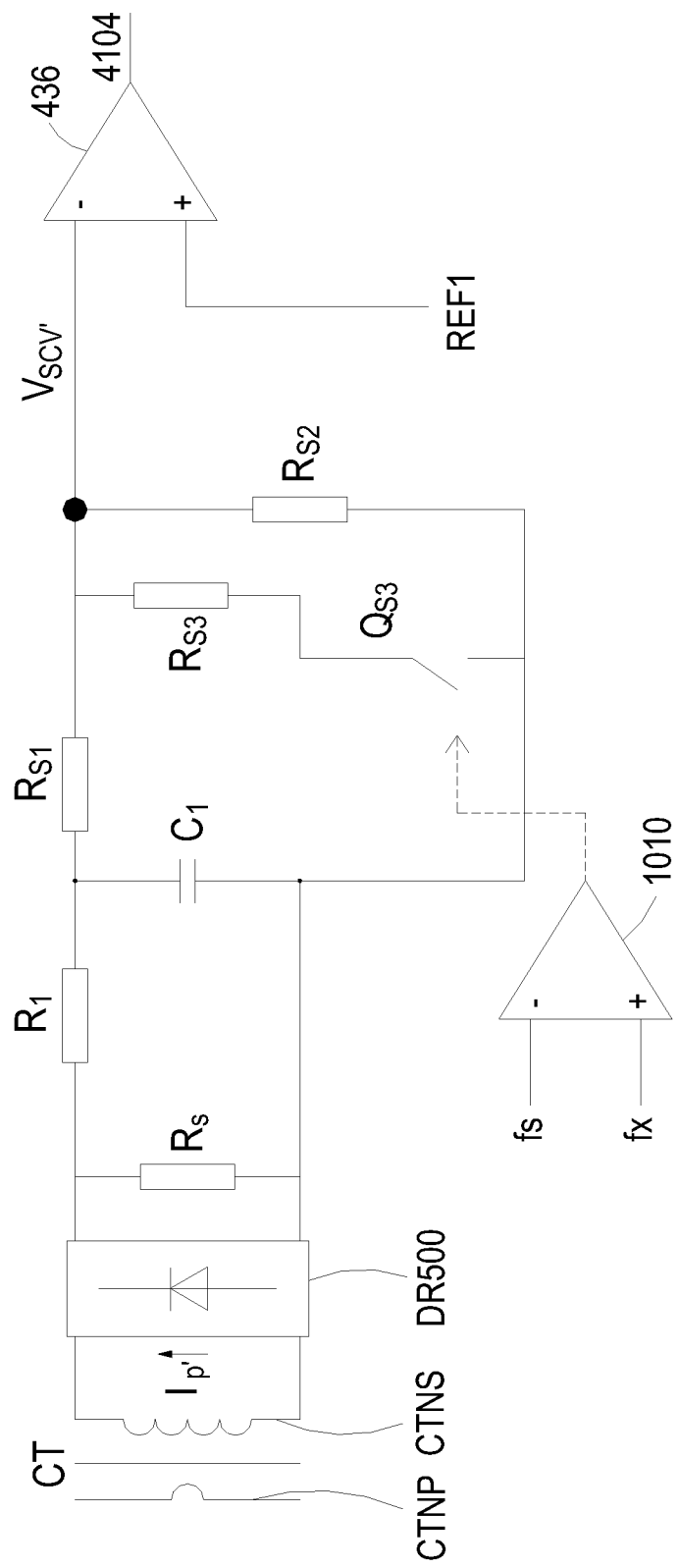
FIG. 11(D) and FIG. 11(E) respectively show the detailed circuitry of the current sensing device 430 and the constant current compare unit of FIG. 10, and the characteristic curve chart showing the characteristic curve between the output current Io and the switching frequency fs as the circuitry of FIG. 11(D) is applied to change the maximum output current.
Figure 11E:
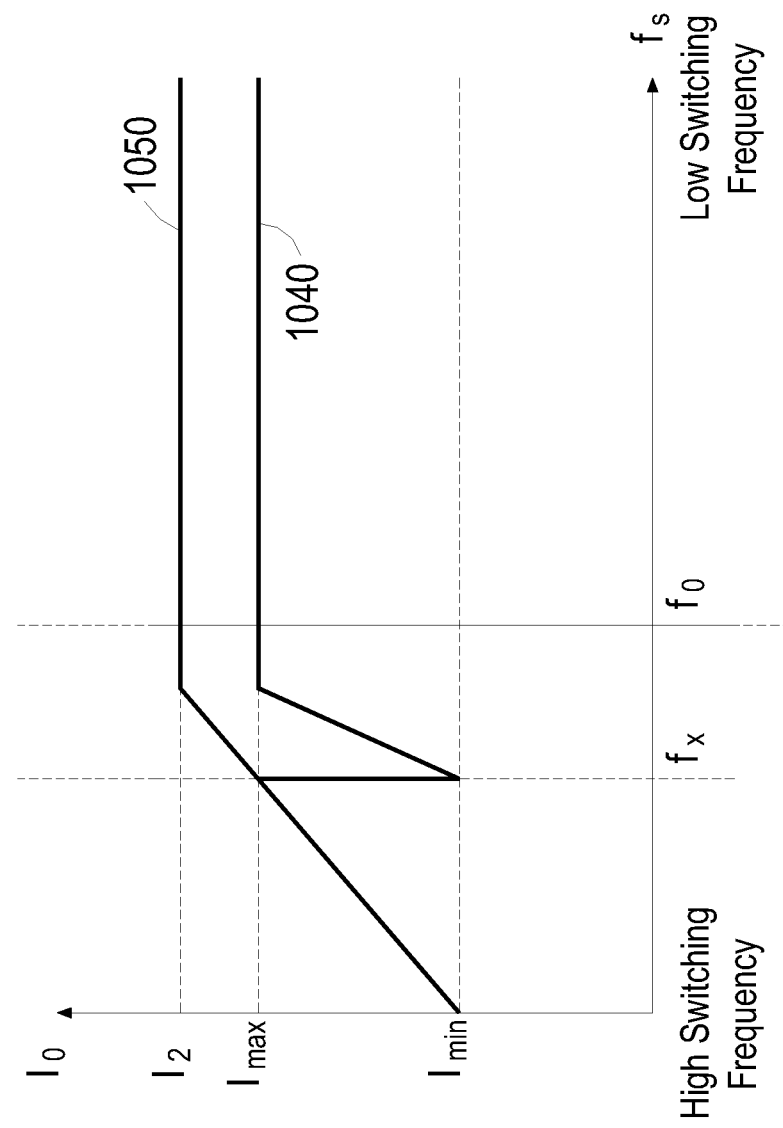

FIG. 11 (D) and FIG. 11(E) respectively show the detailed circuitry of the current sensing device 430 and the constant current compare unit 436 of FIG. 10, and the characteristic curve chart showing the characteristic curve between the output current Io and the switching frequency fs as the circuitry of FIG. 11(D) is applied to change the maximum output current. In FIG. 11(E), the characteristic curve 1050 denotes the relationship between the output current Io and the switching frequency fs as the offsetting circuit is not applied to compensate the current sensing signal, as is the case with the characteristic curve of FIG. 9, while the characteristic curve 1040 denotes the relationship between the output current Io and the switching frequency fs as the offsetting circuit of FIG. 11(D) is applied to change the maximum output current. According to the characteristic curve chart of FIG. 11(E), the current sensing signal Vscv is calculated by the foregoing equation 1 under the condition that the offsetting circuit is not applied to compensate the current sensing signal Vscv.

Under this condition, the maximum sensing error is I2-Icmin, and the maximum output current I2 is higher than the specified maximum constant output current Icmax. As the maximum output current I2 is higher than the specified maximum constant output current Icmax, the circuitry of FIG. 6(B) can not meet the specification. In order to allow the output current to be dispersed in the range of Icmax-Icmin to meet the specification, the circuitry of FIG. 11(D) allows the control unit 1010 to receive the switching frequency fs at its inverting input terminal and to receive the predetermined frequency fx at its non-inverting input terminal. The control unit 1010 of FIG. 11(D) is configured to compare the switching frequency fs and the predetermined frequency fx. Furthermore, the control unit 1010 of FIG. 11(D) is configured to allow the control switch Qs3 to turn on as the switching frequency fs is higher than the predetermined frequency fx, thereby allowing the resistor Rs3 to be attached to the voltage divider consisted of resistors Rs1 and Rs2, and allow the control switch Qs3 to turn off as the switching frequency fs is lower than the predetermined frequency fx, thereby allowing the resistor Rs3 to be detached from the voltage divider consisted of resistors Rs1 and Rs2. Hence, as the switching frequency fs is higher than the predetermined frequency fx, the voltage divider is consisted of the resistors Rs1, Rs2 and Rs3, and thus the compensated current sensing signal Vscv' can be calculated by the foregoing equation 2. As the switching frequency fs is lower than the predetermined frequency fx, the voltage divider is consisted of the resistors Rs1 and Rs2, and thus the compensated current sensing signal Vscv' can be calculated by the foregoing equation 1. Therefore, as the switching frequency fs is higher than the predetermined frequency fx, the relationship between the output current Io and the switching frequency fs is similar to the characteristic curve 1050 which overlaps with the characteristic curve 1040 under this condition. As the switching frequency fs is lower than the predetermined frequency fx, the compensated current sensing signal Vscv' will be higher than the uncompensated current sensing signal Vscv as the resistor Rs3 is detached from the voltage divider. Hence, the maximum output current will be reduced to the specified maximum constant output current Icmax, such that the maximum sensing error is downscaled to Icmax-Icmin, as denoted by the characteristic curve 1040 shown in FIG. 11(E). By employing the offsetting circuit 434 consisted of the resistor Rs3 and the control switch Qs3, the maximum sensing error can be downscaled and the variation of the output current can be confined to the specification. Besides, the control unit 1010 can acquire information associated with the switching frequency of the switching circuit 410 from the switching control circuit 438. Alternatively, the offsetting circuit 434 may include two or more resistors and control switches, and its internal configuration can be designed arbitrarily depending on the design choices without being limited to the precise forms disclosed herein.

Figure 12:
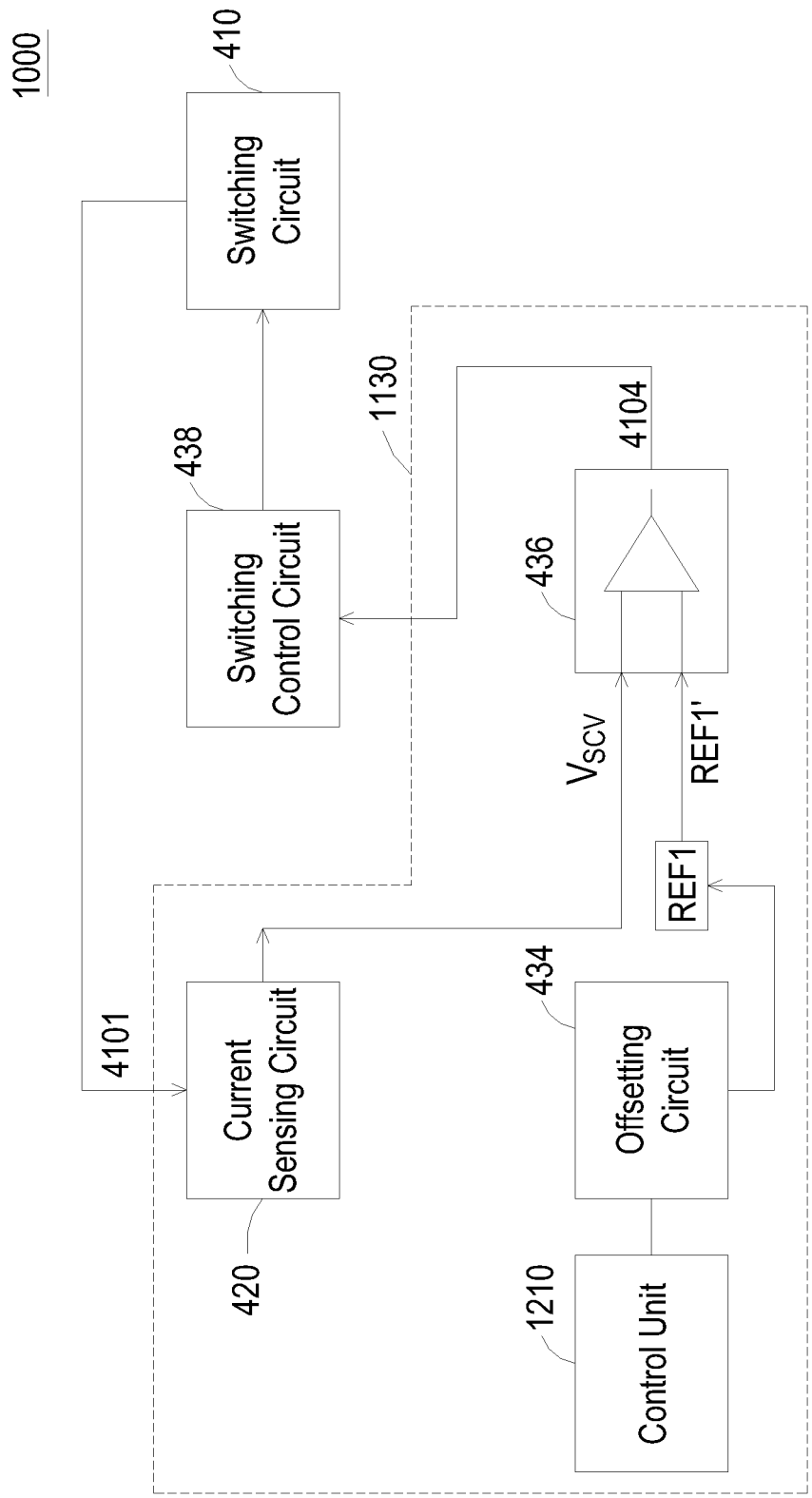
FIG. 12 shows an overall block diagram of a current sensing signal comparing device according to a second embodiment of the invention.

FIG. 12 shows an overall block diagram of a current sensing signal comparing device according to a second embodiment of the invention. Compared to FIG. 10, FIG. 12 illustrates a current sensing signal comparing device 1130 including a current sensing circuit 420, a control unit 1210, an offsetting circuit 434, and a constant current compare unit 436. The current sensing signal comparing device 1130 is configured to allow the current sensing signal Vscv to be transmitted directly to the constant current compare unit 436, and the offsetting circuit 434 is configured to compensate the constant current reference signal REF1 according to the relationship between the switching frequency fs and the predetermined frequency fx in order to generate a compensated constant current reference signal REF1', thereby compensating the sensing error as a result of circuit parameters, current sensing methodology or other factors. The control unit 1210 is configured to manipulate the offsetting circuit 434 to compensate the constant current reference signal REF1 according to the relationship between the switching frequency fs and the predetermined frequency fx. In the instant embodiment, the control unit 1210 is equivalent to the control unit 1010 in the first embodiment. It should be noted that the combination of the current sensing circuit 420 and the constant current compare unit 436 of FIG. 10 according to the first embodiment is functionally equivalent to the current sensing signal comparing device 1130 of FIG. 12 in the instant embodiment, while the difference between them is that the current sensing signal comparing device (430, 436) of FIG. 10 according to the first embodiment is configured to compensate the current sensing signal, and the current sensing signal comparing device 1130 of FIG. 12 according to the second embodiment is configured to compensate the constant current reference signal.

Figure 13A:
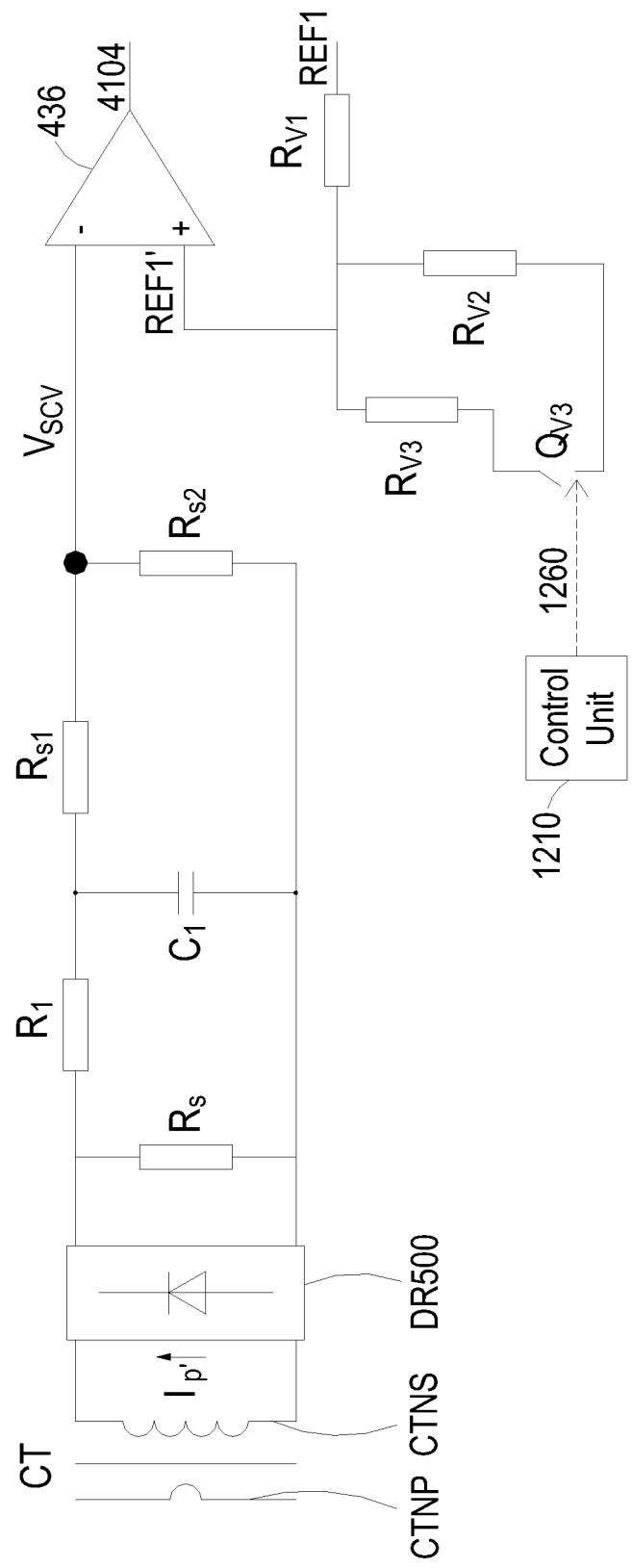
FIG. 13(A) and FIG. 13(B) respectively show the detailed circuitry of the current sensing signal comparing device of FIG. 12, and the characteristic curve chart showing the characteristic curve between the output current Io and the switching frequency fs as the circuitry of FIG. 13(A) is applied to change the maximum output current.
Figure 13B:
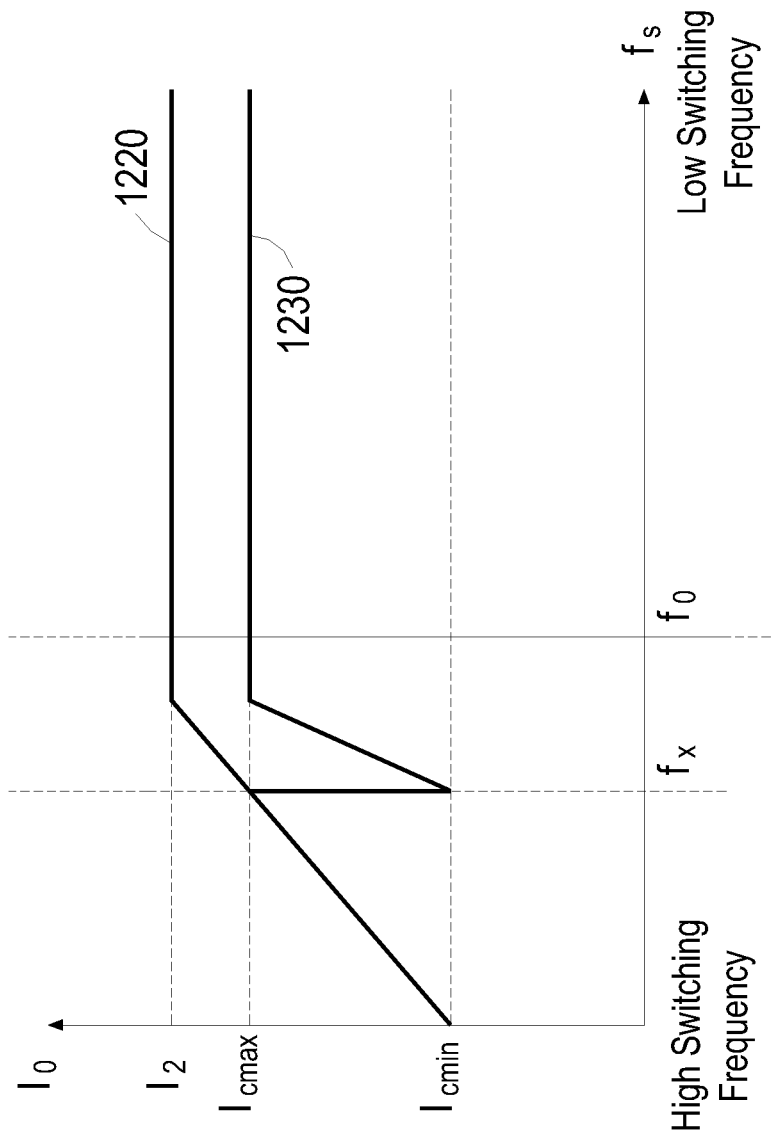

FIG. 13(A) and FIG. 13(B) respectively show the detailed circuitry of the current sensing signal comparing device 1130 of FIG. 12, and the characteristic curve chart showing the characteristic curve between the output current Io and the switching frequency fs as the circuitry of FIG. 13(A) is applied to change the maximum output current. In FIG. 13(B), the characteristic curve 1220 denotes the relationship between the output current Io and the switching frequency fs as the offsetting circuit is not applied, as the characteristic curve of FIG. 9, while the characteristic curve 1230 denotes the relationship between the output current Io and the switching frequency fs as the offsetting circuit of FIG. 13(A) is applied to change the maximum output current. As denoted by the characteristic curve 1220 of FIG. 13(B), as the offsetting circuit is not applied, the maximum sensing error is I2-Icmin and the maximum output current I2 is higher than the specified maximum constant output current Icmax. As the maximum output current I2 is higher than the specified maximum constant output current Icmax, the circuitry of FIG. 6(B) can not meet the specification. In order to allow the output current to be dispersed in the range of Icmax-Icmin to meet the specification, the circuitry of FIG. 13(A) includes an offsetting circuit consisted of resistors Rv1, Rv2, Rv3, and a control switch Qv3. One end of the resistor Rv1 is connected to a reference signal REF2 and the other end of the resistor Rv1 is connected to a non-inverting input terminal of the constant current compare unit 436. One end of the resistor Rv2 is connected to the non-inverting input terminal of the constant current compare unit 436 and the other end of the resistor Rv2 is connected to the ground terminal. One end of the resistor Rv3 is connected to the non-inverting input terminal of the constant current compare unit 436 and the other end of the resistor Rv3 is connected to a first current-conducting terminal of the control switch Qv3. The second current-conducting terminal of the control switch Qv3 is connected to the ground terminal and the control terminal of the control switch Qv3 is connected to the control unit 1210 for receiving a control signal 1260. The control unit 1210 is configured to manipulate the switch Qv3 to turn on as the switching frequency fs is lower than the predetermined frequency fx, thereby allowing the resistor Rv3 to be attached to the voltage divider consisted of resistors Rv1 and Rv2, and manipulate the switch Qv3 to turn off as the switching frequency fs is higher than the predetermined frequency fx, thereby allowing the resistor Rv3 to be detached from the voltage divider consisted of resistors Rv1 and Rv2. It should be noted that the constant current reference signal REF1 disclosed in the foregoing embodiment of the invention is identical to the reference signal of reference signal REF2 being divided by the voltage divider (Rv1, Rv2). Hence, as the switching frequency fs is higher than the predetermined frequency fx, the voltage divider is consisted of resistors Rv1 and Rv2, and thus the compensated constant current reference signal REF1' is identical to the constant current reference signal REF1 disclosed in the foregoing embodiment, and can be calculated by the following equation:

$$REF1'=REF2 \times Rv2/(Rv1+Rv2) \quad \text{(Equation 3)}$$

As the switching frequency fs is lower than the predetermined frequency fx, the voltage divider is consisted of resistors Rv1, Rv2 and Rv3, and thus the compensated constant current reference signal REF1' can be calculated by the following equation:

$$REF1'=REF2 \times (Rv2//Rv3)/(Rv1+(Rv2//Rv3)) \quad \text{(Equation 4)}$$

Where (Rv2//Rv3) is the equivalent resistance of the resistors Rv2 and Rv3 being connected in parallel. Therefore, as the switching frequency fs is higher than the predetermined frequency fx, the relationship between the output current Io and the switching frequency fs is similar to the characteristic curve 1220, while the characteristic curve 1220 will overlap with the characteristic curve 1230 under this condition. As the switching frequency fs is lower than the predetermined frequency fx, the resistor Rv3 is attached to the voltage divider such that the compensated constant current reference signal REF1' is lower than the uncompensated constant current reference signal. Therefore, as the compensated constant current reference signal REF1' inputted to the non-inverting input terminal of the constant current compare unit 436 is lowered, the maximum output current will be downscaled to the specified maximum constant output current Icmax, such that the maximum sensing error is downscaled to Icmax-Icmin, as denoted by the characteristic curve 1230 of FIG. 13(B). By employing the offsetting circuit 434 consisted of resistors Rv1, Rv2, Rv3, and the control switch Qv3, the maximum sensing error can be downscaled and the variation of the output current can be confined to the specification. Besides, the control unit 1210 can acquire information associated with the switching frequency of the switching circuit 410 from the switching control circuit 438. Alternatively, the offsetting circuit 434 may include two or more resistors and control switches, and its internal configuration can be designed arbitrarily depending on the design choices without being limited to the precise forms disclosed herein.

Figure 13C:
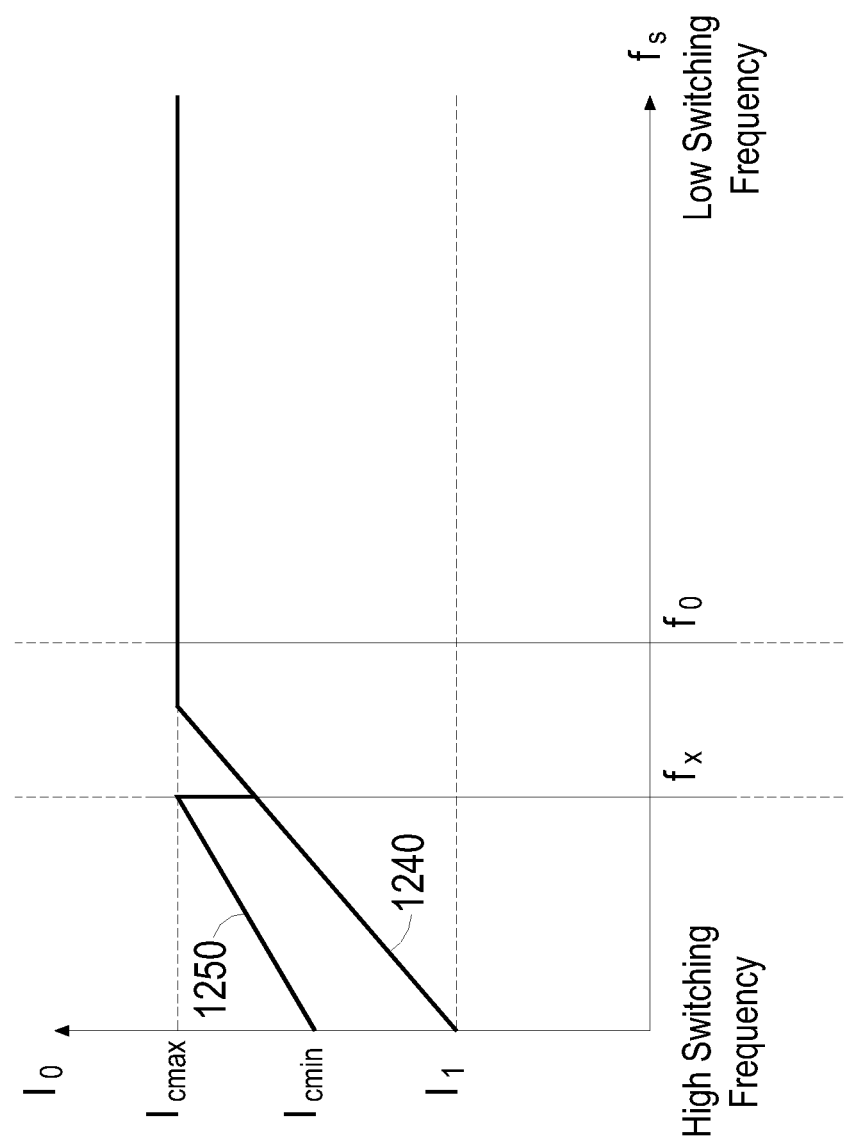
FIG. 13(C) is a characteristic curve chart showing the characteristic curve between the output current Io and the switching frequency fs as the circuitry of FIG. 13(A) is applied to change the minimum output current

FIG. 13(A) and FIG. 13(C) respectively show the detailed circuitry of the current sensing signal comparing device 1130 of FIG. 12, and the characteristic curve chart showing the characteristic curve between the output current To and the switching frequency fs as the circuitry of FIG. 13(A) is applied to change the minimum output current. In FIG. 13(C), the characteristic curve 1240 denotes the relationship between the output current To and the switching frequency fs as the offsetting circuit is not applied to compensate the current sensing signal, as the characteristic curve of FIG. 9, while the characteristic curve 1250 denotes the relationship between the output current To and the switching frequency fs as the offsetting circuit of FIG. 13(A) is applied to change the maximum output current. According to the characteristic curve 1240 of FIG. 13(C), as the offsetting circuit is not applied, the maximum sensing error is Icmax-I1 and the minimum output current I1 is lower than the specified minimum constant output current Icmin. As the minimum output current I1 is lower than the specified minimum constant output current Icmin, the circuitry of FIG. 6(B) can not meet the specification. In order to allow the output current to be dispersed in the range of Icmax-Icmin to meet the specification, the control unit 1210 of FIG. 13(A) is configured to allow the switch Qv3 to turn on as the switching frequency fs is lower than the predetermined frequency fx, thereby attaching the resistor Rv3 to the voltage divider consisted of resistors Rv1 and Rv2, and allow the switch Qv3 to turn off as the switching frequency fs is higher than the predetermined frequency fx, thereby detaching the resistor Rv3 from the voltage divider consisted of resistors Rv1 and Rv2. Therefore, as the switching frequency fs is lower than the predetermined frequency fx, the voltage divider is consisted of resistors Rv1, Rv2 and Rv3 and the compensated constant current reference signal REF1' can be calculated by the foregoing equation 4. As the switching frequency fs is higher than the predetermined frequency fx, the voltage divider is consisted of resistors Rv1 and Rv2 and the compensated constant current reference signal REF1' can be calculated by the foregoing equation 3. Therefore, as the switching frequency fs is lower than the predetermined frequency fx, the relationship between the output current To and the switching frequency fs is similar to the characteristic curve 1240, in which the characteristic curve 1240 which overlaps with the characteristic curve 1250 under this condition. As the switching frequency fs is lower than the predetermined frequency fx, the resistor Rv3 is detached from the voltage divider such that the compensated constant current reference signal REF1' is higher than the uncompensated constant current reference signal. Therefore, as the compensated constant current reference signal REF1' inputted to the non-inverting input terminal of the constant current compare unit 436 is heightened, the minimum output current will be promoted to the specified minimum constant output current Icmin, such that the maximum sensing error is downscaled to Icmax-Icmin, as denoted by the characteristic curve 1250 of FIG. 13(C). By employing the offsetting circuit 434 consisted of resistors Rv1, Rv2, Rv3, and the control switch Qv3, the maximum sensing error can be downscaled and the variation of the output current can be confined to the specification. Besides, the control unit 1210 can acquire information associated with the switching frequency of the switching circuit 410 from the switching control circuit 438. Alternatively, the offsetting circuit 434 may include two or more resistors and control switches, and its internal configuration can be designed arbitrarily depending on the design choices without being limited to the precise forms disclosed herein.

Figure 14A:
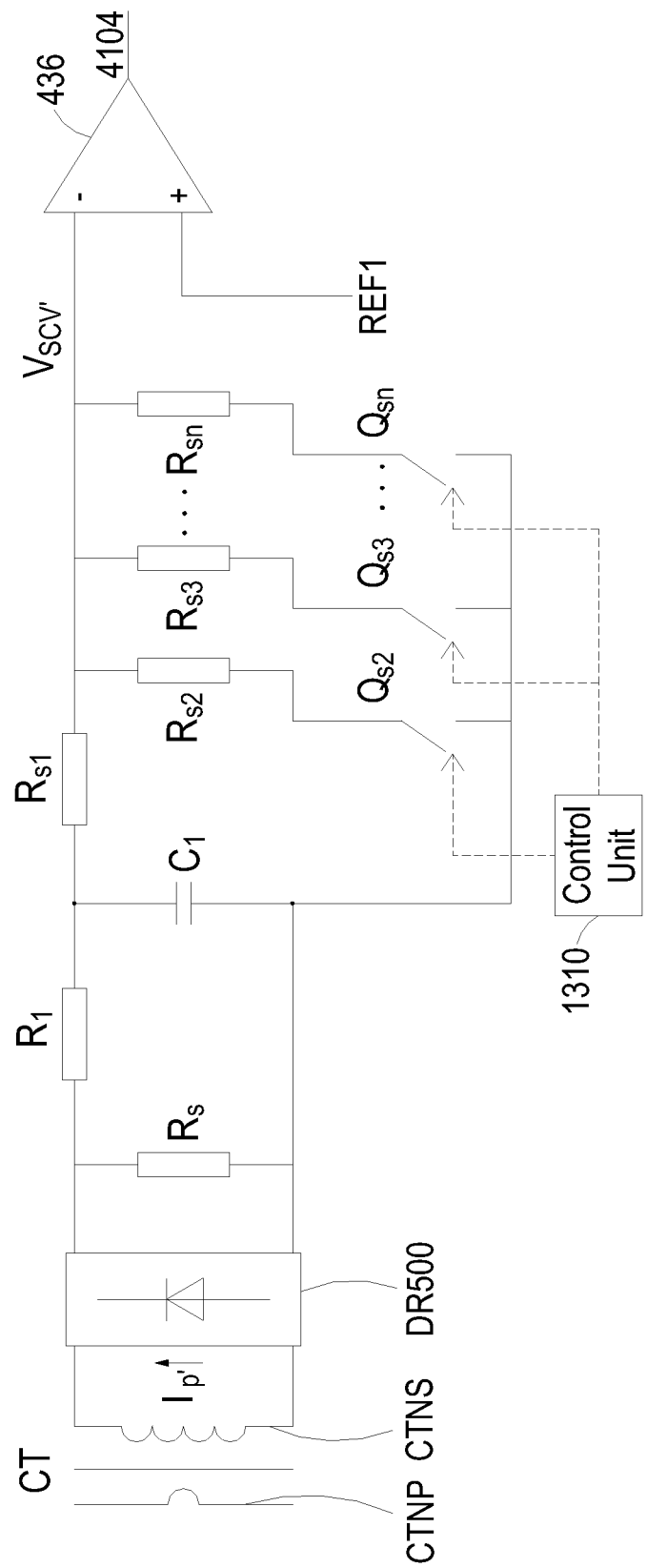
FIG. 14(A) shows an extended modification of FIG. 11(A) pertaining to the first embodiment.
Figure 14B:
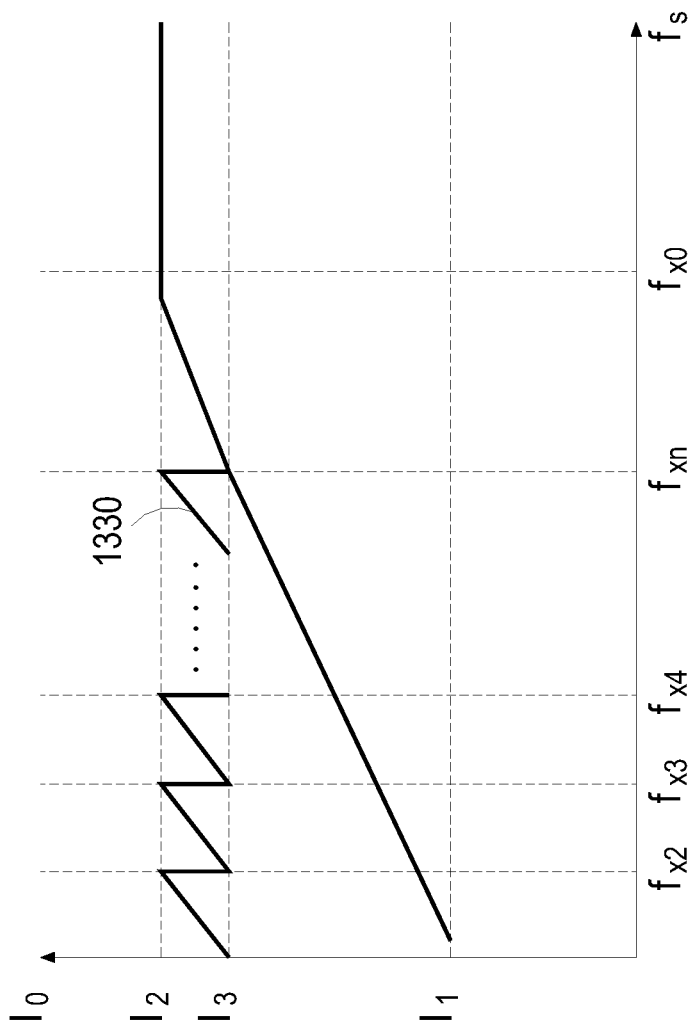
FIG. 14(B) is a characteristic curve chart showing the relationship between the output current Io and switching frequency fs as the circuitry of FIG. 14(A) is applied to compensate the current sensing signal.

FIG. 14(A) shows an extended modification of FIG. 11(A) pertaining to the first embodiment. FIG. 14(B) is a characteristic curve chart showing the relationship between the output current Io and switching frequency fs as the circuitry of FIG. 14(A) is applied to compensate the current sensing signal. Compared to the circuitry of FIG. 11(A), the serially-connected resistor-switch pair of FIG. 11(A) is extended to a plurality of serially-connected resistor-switch pairs, and the serially-connected resistor-switch pairs are connected in parallel with each other, as shown in FIG. 14. In FIG. 14(A), a plurality of serially-connected resistor-switch pairs (Rs2-Qs2, Es3, Qs3, . . . , Rsn-Qsn) are connected in parallel with each other and are connected between the inverting input terminal of the constant current compare unit 436 and the ground terminal. A control unit 1310 which is equivalent to the control unit 1010 of FIG. 10 is connected to the control terminals of the control switches Qs2, Qs3, . . . , Qsn to manipulate the switching of the control switches Qs2, Qs3, . . . , Qsn. Hence, the relationship between the output current Io and the switching frequency fs will be denoted by the characteristic curve 1330 shown in FIG. 14(B), in which the control switches Qs2, Qs3, . . . , Qsn are sequentially turned on as the switching frequency sequentially reaches a predetermined frequency (fxn, . . . , fx4, fx3, fx2, fx1), thereby allowing the resistor which is connected with a conducting switch to be attached to the voltage divider for the current sensing signal Vscv in order to change the relationship between the output current Io and the switching frequency fs. Therefore, the sensing error of the current sensing signal is confined to a specified range.

Figure 15A:
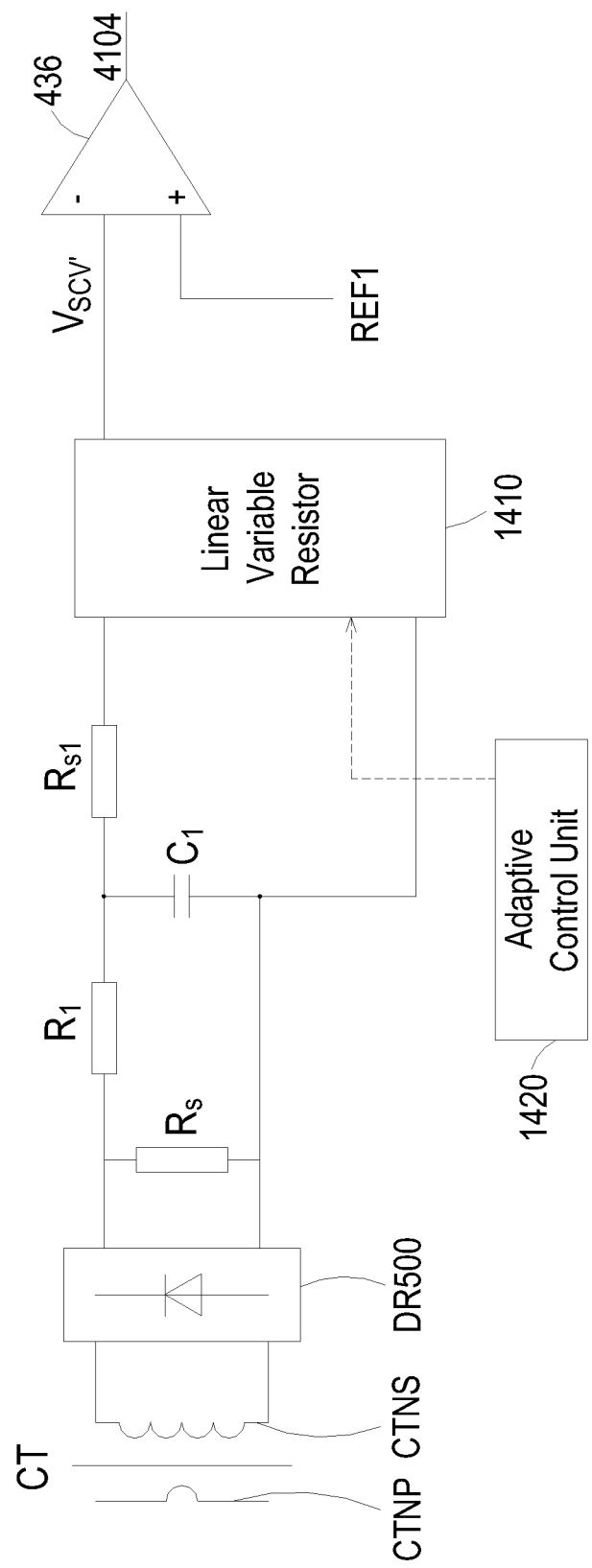
FIG. 15(A) shows a utilitarian modification of the first embodiment.
Figure 15B:
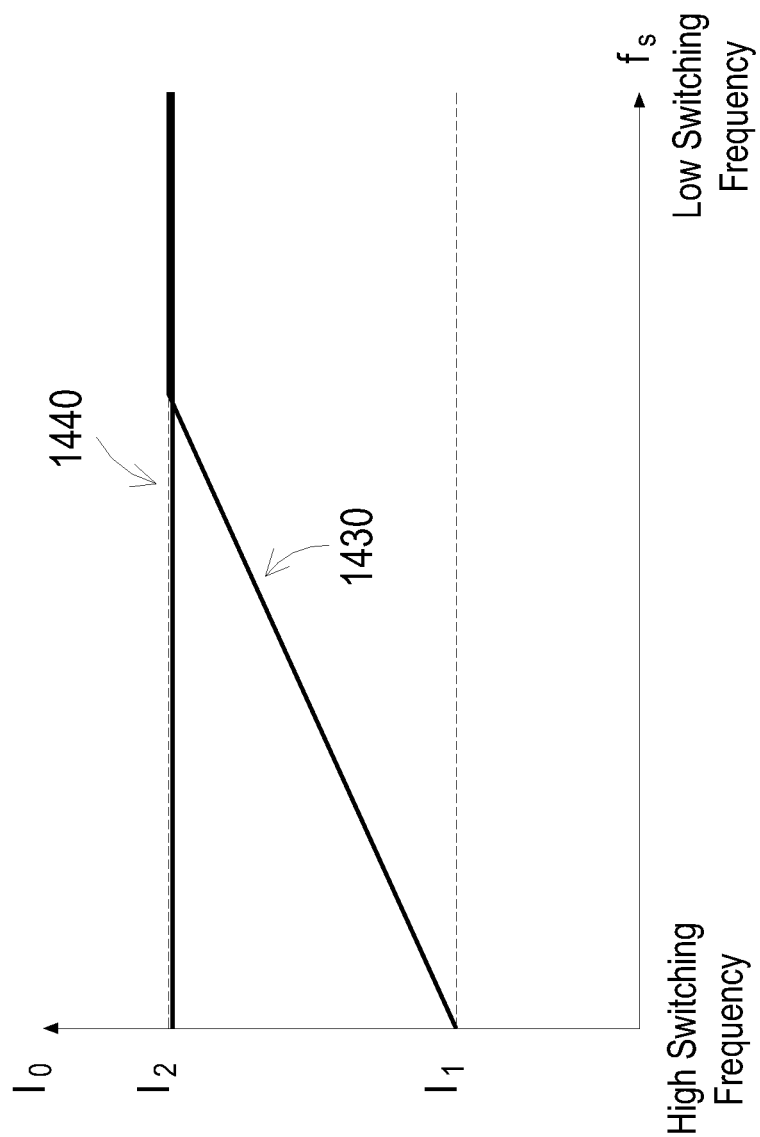
FIG. 15(B) shows a characteristic curve chart showing the relationship between the output current Io and the switching frequency fs as the circuitry of FIG. 15(A) is applied to compensate the current sensing signal.

FIG. 15(A) shows a utilitarian modification of the first embodiment, and FIG. 15(B) shows a characteristic curve chart showing the relationship between the output current Io and the switching frequency fs as the circuitry of FIG. 15(A) is applied to compensate the current sensing signal. Compared to FIG. 14(A), the serially-connected resistor-switch pairs (Rs2-Qs2, Es3, Qs3, . . . , Rsn-Qsn) of FIG. 14(A) are replaced with a linear variable resistor 1410 in FIG. 15(A), while the control unit 1310 is replaced with an adaptive control unit 1420 which can issue control signals to the linear variable resistor 1410 according to different frequencies. The linear variable resistor 1410 is a variable resistor with its resistance being linearly varied by the control unit 1420. Therefore, the sensing error of the current sensing signal can be completely compensated through the use of the linear variable resistor 1410 and the adaptive control unit 1420 of FIG. 15(A). Hence, the relationship between the output current Io and the switching frequency fs is denoted by a horizontal line 1440 with a constant output current I2 as shown in FIG. 15(B) as the offsetting circuit 434 consisted of the linear variable resistor 1410 and the adaptive control unit 1420 are applied to compensate the current sensing error, instead of the characteristic curve 1430 denoting the relationship between the output current Io and the switching frequency fs as the sensing error remains uncompensated.

Figure 16A:
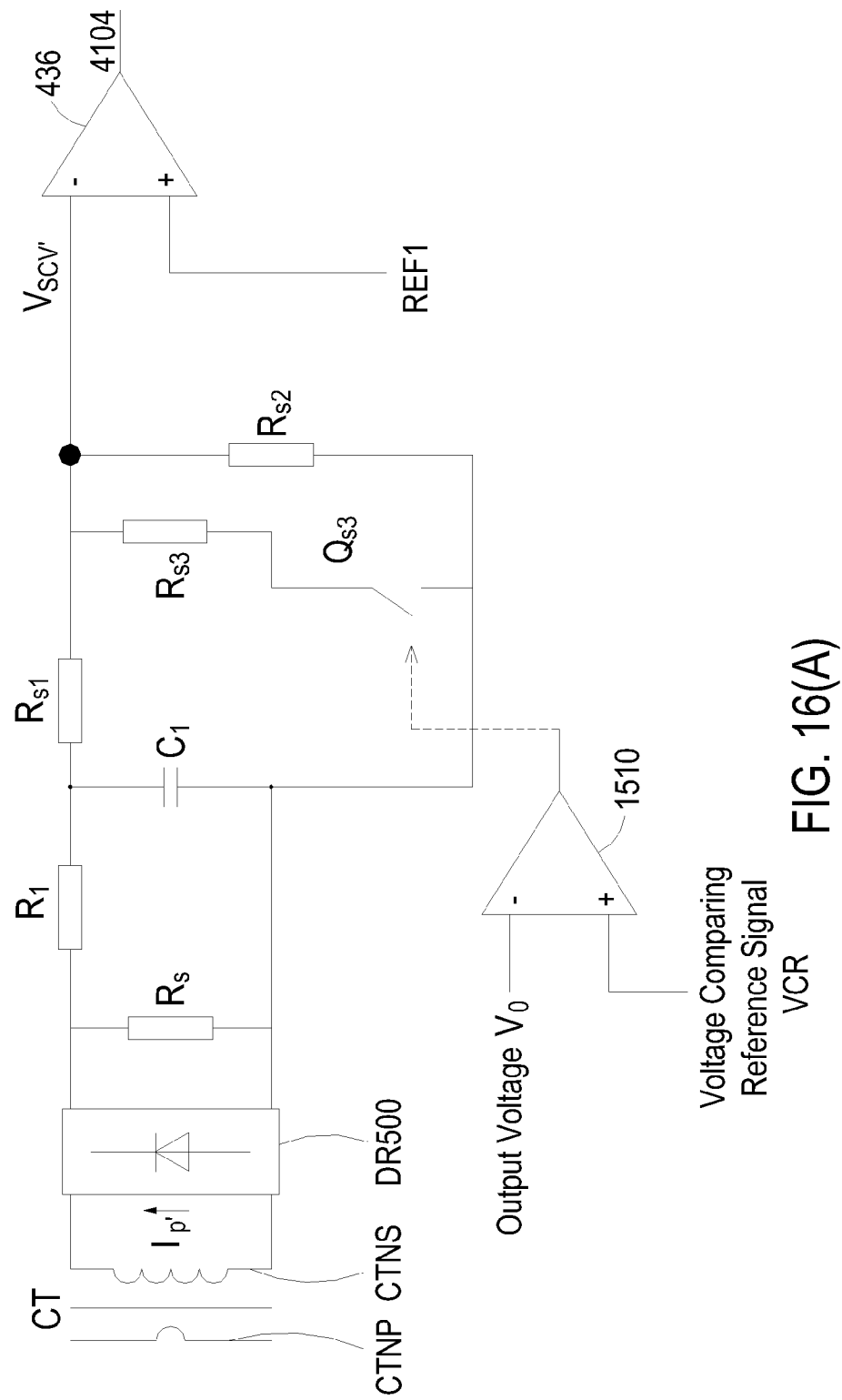
FIG. 16 (A) and FIG. 16(B) respectively show a modification of the circuitry of FIG. 11(A), and the characteristic curve chart showing the characteristic curve between the output current Io and the output voltage Vo as the circuitry of FIG. 16(A) is applied to change the minimum output current.
Figure 16B:
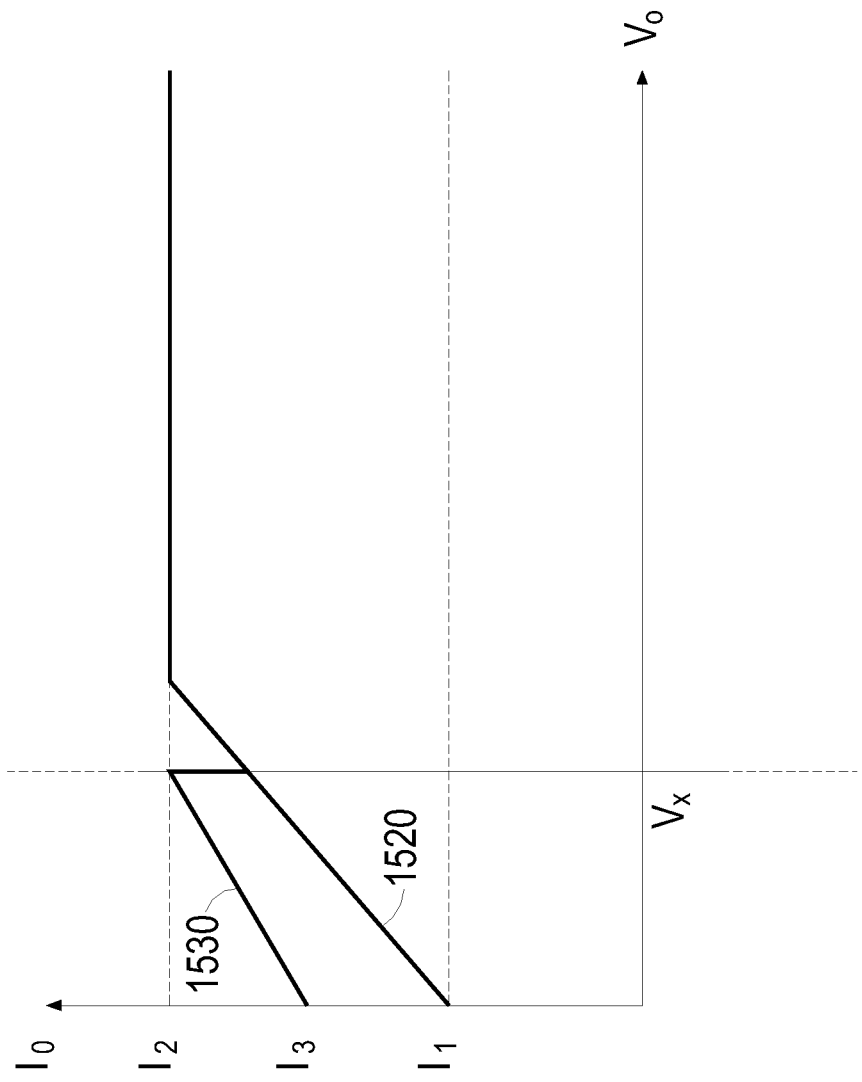

Referring to FIG. 10, FIG. 11 and FIG. 16, in which FIG. 16(A) and FIG. 16(B) respectively show a modification of the circuitry of FIG. 11(A), and the characteristic curve chart showing the characteristic curve between the output current Io and the output voltage Vo as the circuitry of FIG. 16(A) is applied to change the minimum output current. It should be noted that the output voltage of the power converter is inversely proportional to the switching frequency fs, and the magnitude of the output voltage Vo increases progressively along the positive direction of the horizontal axis. In FIG. 16(B), the characteristic curve 1520 denotes the relationship between the output current Io and the output voltage Vo as the current sensing signal remain uncompensated. Compared to FIG. 11(A), the circuitry of FIG. 16(A) employs a voltage compare unit 1510 to compare the output voltage Vo of the power converter 1000 with a voltage comparing reference signal VCR, thereby issuing a control signal to manipulate the control switch Qs3 according to the comparison result. It should be noted that the voltage compare unit 1510 is equivalent to the control unit 1010 of FIG. 10. Unlike the foregoing embodiments that employ the switching frequency fs as the criterion to determine whether the resistor serially connected with a control switch is attached to or detached from a voltage divider in order to compensate the current sensing signal or the constant current reference signal, the offsetting circuit of FIG. 16(A) employ the output voltage Vo as the criterion to determine whether the resistor serially connected with a control switch is attached to or detached from a voltage divider in order to compensate current sensing signal or constant current reference signal. By employing the offsetting circuit of FIG. 16(A), a characteristic curve 1530 shown in FIG. 16(B) is attained that allows compensation to be offered to change the minimum output current as the output voltage Vo is lower than a predetermined voltage Vx, in which the characteristic curve 1520 will overlap with the characteristic curve 1530 under the condition that the output voltage Vo is higher than the predetermined voltage Vx.

Figure 17:
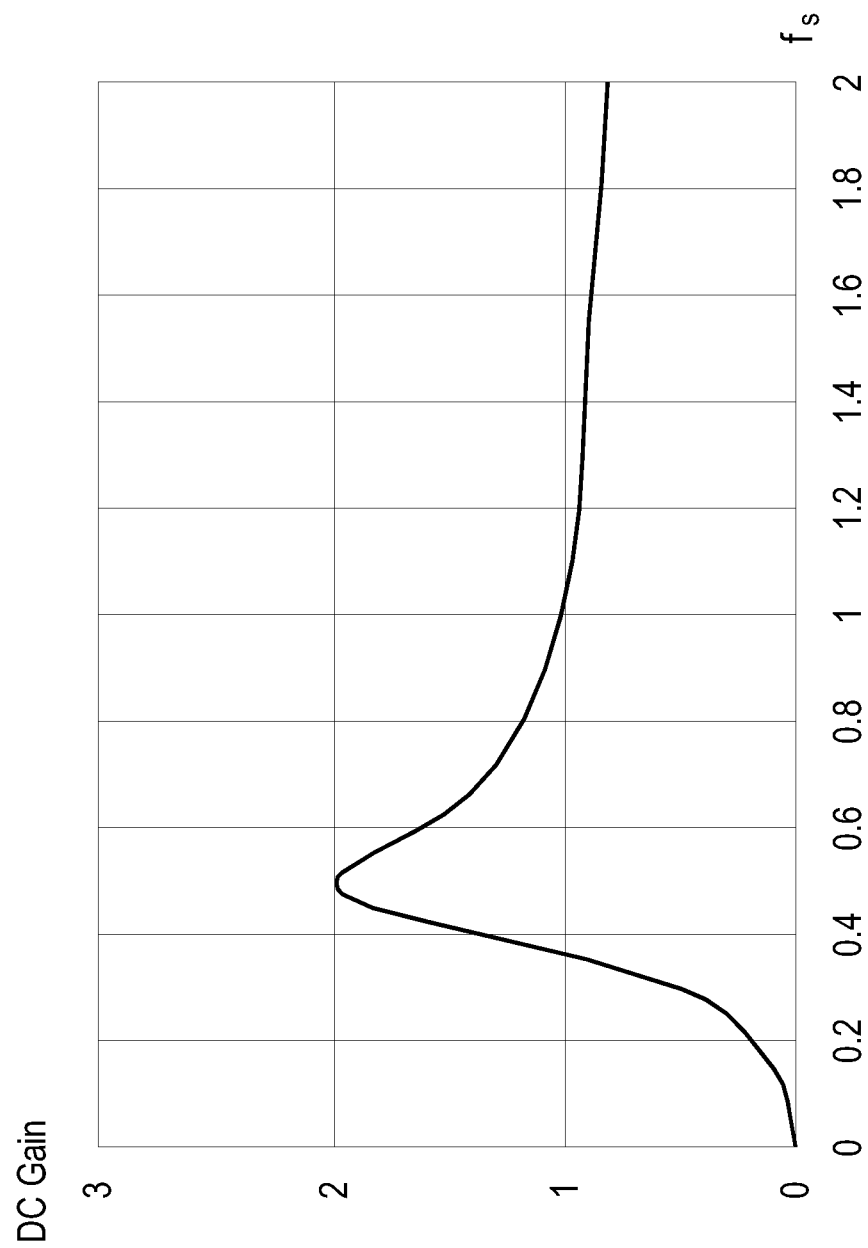
FIG. 17 shows the DC gain chart of the power converter employing the current sensing device of the invention.

Referring to FIG. 10 and FIG. 17, in which FIG. 17 shows the DC gain chart of the power converter 1000 employing the current sensing device 430 of the invention. The DC gain chart of the power converter 1000 employing the current sensing device 430 of the invention can be calculated by the following equation:

$$M = n \times Vo/Vn \quad \text{(equation 5)}$$

Where M is the DC gain of the power converter 1000, Vo is the output voltage of the power converter 1000, n is the turn ratio of the transformer T100, and Vn is the DC bus voltage at the secondary side of the transformer T100. If the output voltage Vo is lowered, the switching frequency fs of the power converter 1000 will increase, resulting in significant sensing error.

Referring to FIG. 16(A), FIG. 16(B) and FIG. 17. As can be known from the DC gain chart of FIG. 17, a lower output voltage Vo is mapped to a higher switching frequency fs. As the output voltage Vo is lower than a predetermined voltage Vx in which the predetermined voltage Vx may be the voltage corresponding to the aforesaid predetermined frequency fx and the voltage comparing reference signal VCR is close to the predetermined voltage Vx, the voltage compare unit 1510 issues a high-level signal to the control switch Qs3. The control switch Qs3 is turned on accordingly and the resistor Rs3 is attached to the voltage divider for the current sensing signal Vscv in order to generate a compensated current sensing signal Vscv'. In the meantime, the compensated current sensing signal Vscv' can be calculated by the foregoing equation 2. As the output voltage Vo is higher than the predetermined voltage Vx, the voltage compare unit 1510 issues a low-level signal to the control switch Qs3. The control switch Qs3 is turned off accordingly and the resistor Rs3 is detached from the voltage divider for the current sensing signal Vscv. In the meantime, the compensated current sensing signal Vscv' can be calculated by the foregoing equation 1. Therefore, the maximum sensing error can be downscaled from I2-I1 to I2-I3, thereby promoting the accuracy in current sensing.

Also, it should be noted that the constant current compare unit 436 is configured to compare the compensated current sensing signal Vscv' with the constant current reference signal REF1, or compare the current sensing signal Vscv with the compensated constant current reference signal REF1', in order to generate the constant current control signal 4104. Nevertheless, if it is not desired to maintain the output current Io at a constant level, an alternative scenario for current sensing can be achieved by compensating the current sensing signal Vscv to generate a compensated current sensing signal Vscv' and directly transmitting the compensated current sensing signal Vscv' to the switching control circuit 438, thereby monitoring the variation of the output current Io.

Figure 18:
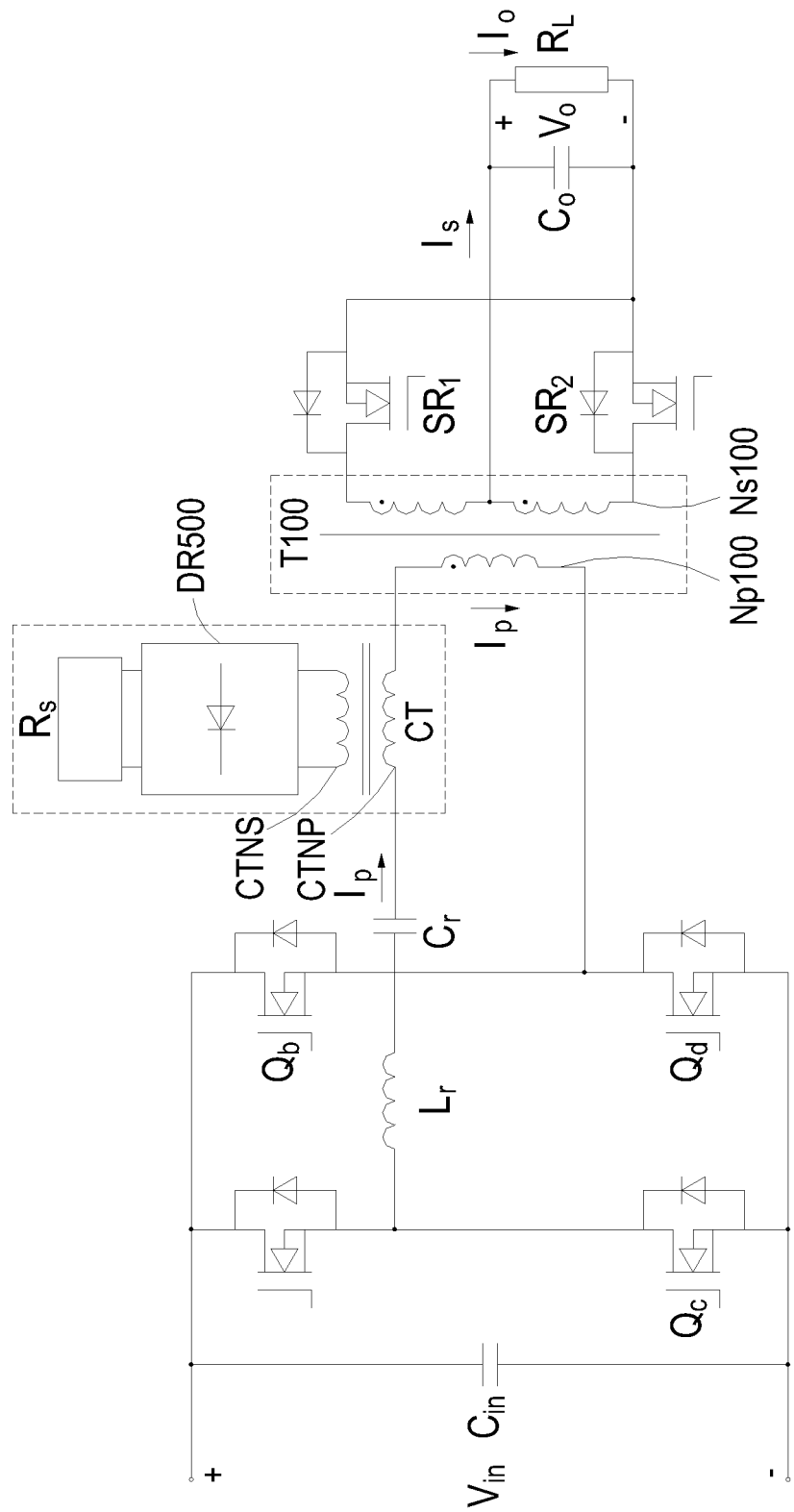
FIG. 18 shows a modification of FIG. 5(A)
Figure 19:
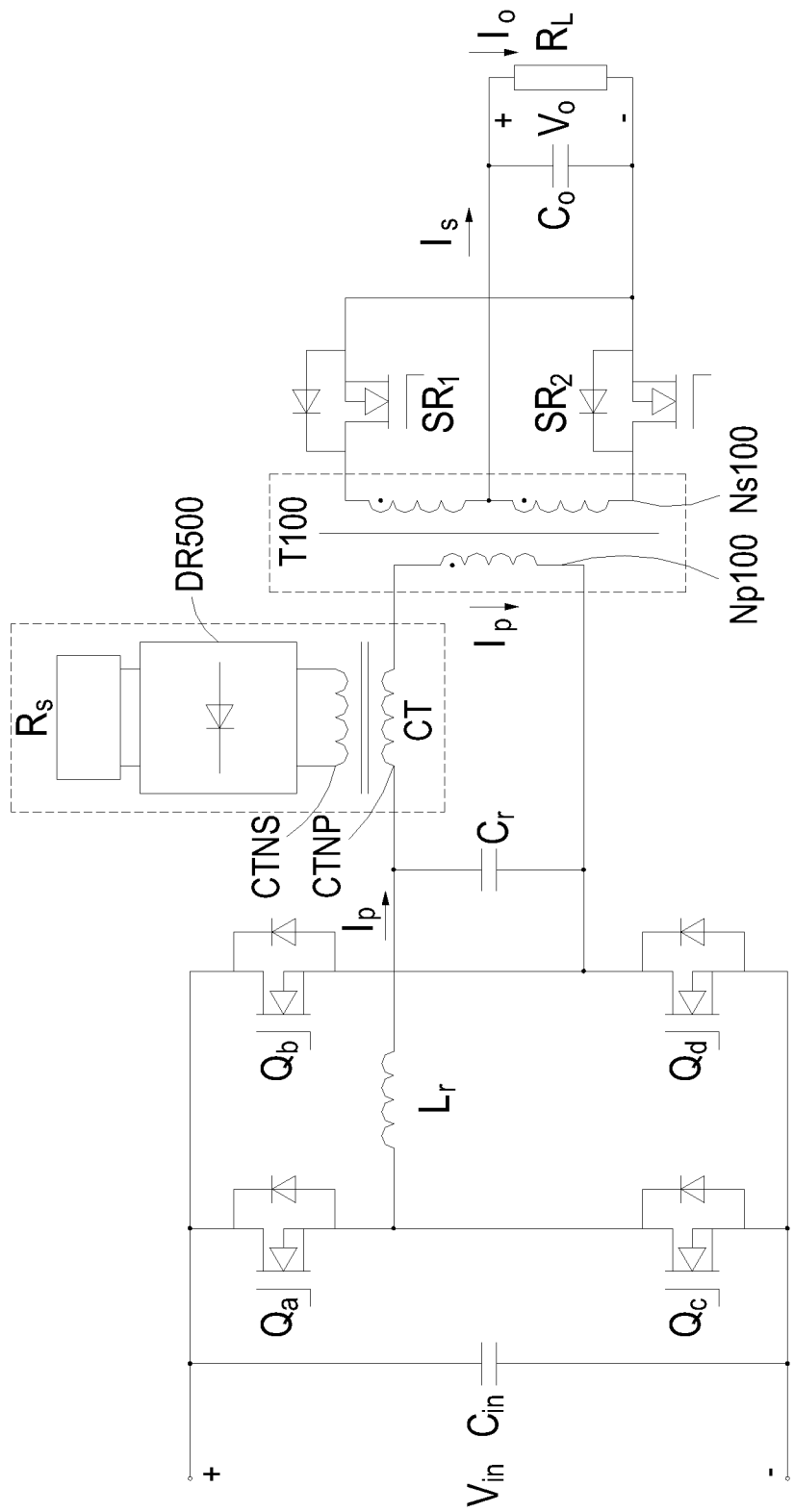
FIG. 19 shows another modification of FIG. 5(A)

FIG. 18 shows a modification of FIG. 5(A). Unlike the power converter of FIG. 5(A) which employs a LLC resonant circuit to accomplish the energy transfer operation for the transformer T100, the power converter of FIG. 18 employs a series resonant circuit consisted of a resonant inductor Lr and a resonant capacitor Cr to replace the LLC resonant circuit of FIG. 5(A). Alternatively, FIG. 19 shows another modification of FIG. 5(A), in which a parallel resonant circuit consisted of a resonant inductor Lr and a resonant capacitor Cr is employed to replace the LLC resonant circuit of FIG. 5(A). As the current sensing circuit 420 is placed at the primary side Np100 of the transformer T100 and includes a diode rectifier DR500, the relationship between the output current and the switching frequency with reference to the power converter of FIG. 18 and the power converter of FIG. 19 will be similar to the relationship between the output current and the switching frequency with reference to the power converter of FIG. 5(A). Thus, the current sensing device 430 and the current sensing signal comparing device ((430,436), 1130) can not only be applied to the power converter of FIG. 5(A), but also can be applied to the power converter of FIG. 18 and the power converter of FIG. 19 as well.

Figure 20:
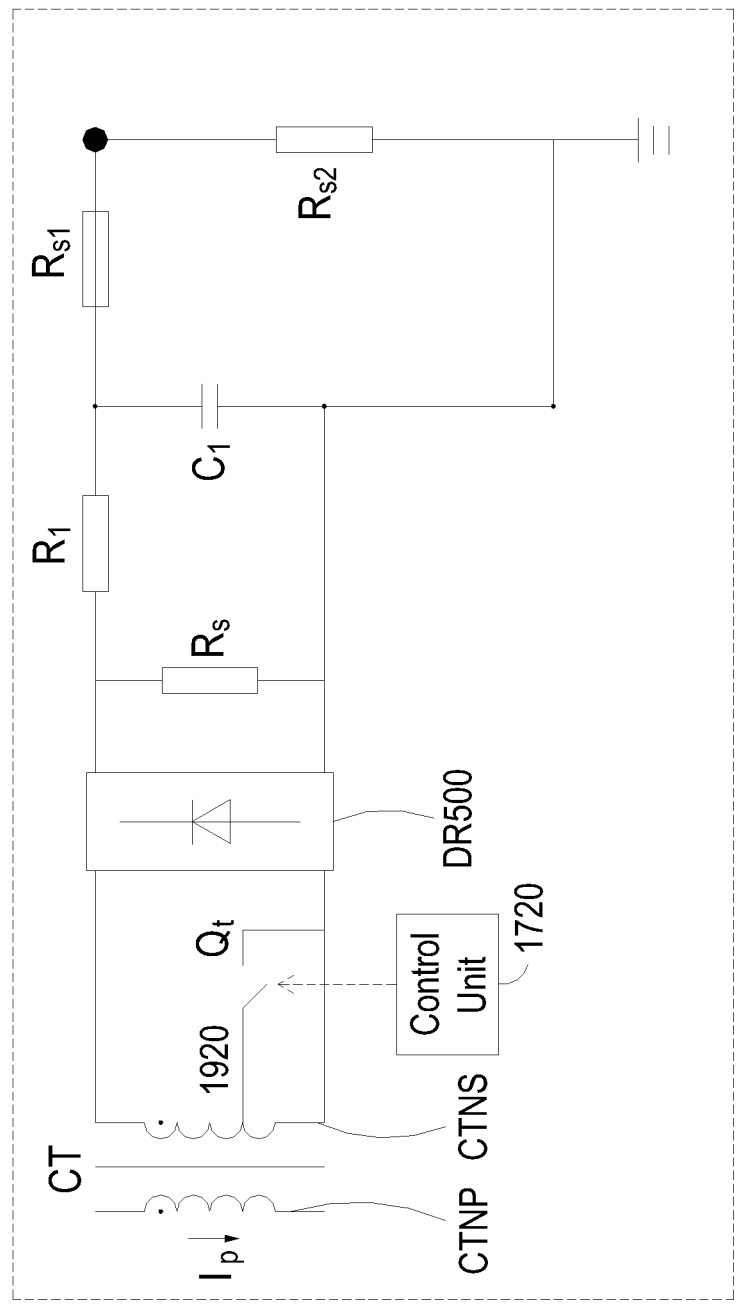
FIG. 20 shows a modification of the circuitry of FIG. 11(A)

FIG. 20 shows a modification of the circuitry of FIG. 11(A). Compared to FIG. 11(A), the secondary winding CTNS of the current transformer CT of FIG. 20 includes a tap 1920 connected to a switch Qt, which has a control terminal connected to a control unit 1720. The control unit 1720 manipulates the switch Qt. The control unit 1720 is equivalent to the control unit 1010 of FIG. 10, and the tap 1920 and the switch Qt constitute the offsetting circuit 434 of the first embodiment. The tap 1920 may be mounted at any place on the secondary winding CTNS and the turn ratio of the current transformer CT can be varied by the switching of the switch Qt.

Figure 21:
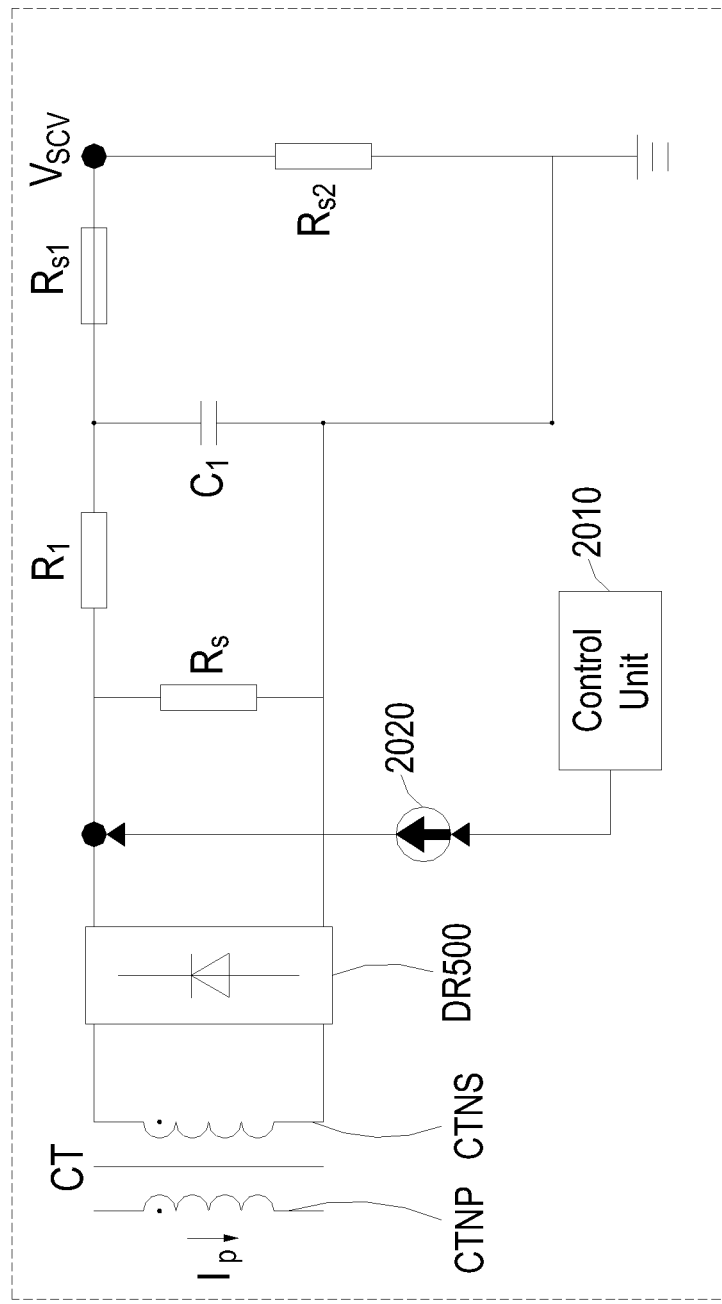
FIG. 21 shows another modification of the circuitry of FIG. 11(A)

FIG. 21 shows another modification of the circuitry of FIG. 11(A). Compared to FIG. 11(A), a current source 2020 is added and connected to the diode rectifier DR500 for changing the magnitude of the current sensing signal Vscv. The current source 2020 is manipulated by a control unit 2010 such that the current source 2020 can inject current into the current sensing circuit 420 as the switching frequency fs is low and draw current from the current sensing circuit 420 as the switching frequency fs is high, thereby lowering the sensing error of the current sensing signal Vscv. The control unit 2010 is equivalent to the control unit 1010 of FIG. 10, and the current source 2020 constitutes the offsetting circuit 434 of the first embodiment. Alternatively, the control unit 2010 may manipulate the current source 2020 according to the switching frequency fs of the power converter, the output voltage Vo of the power converter, the switch component temperature of the power converter, or the ambient temperature of the power converter.

The foregoing embodiments are aimed at compensating the current sensing error caused by the switching circuit and the current sensing circuit in order to actually manifest the output current and generate a current sensing signal with sufficient accuracy. In addition, the invention can be applied to protect the switch components or other components in the power converter.

Figure 22:
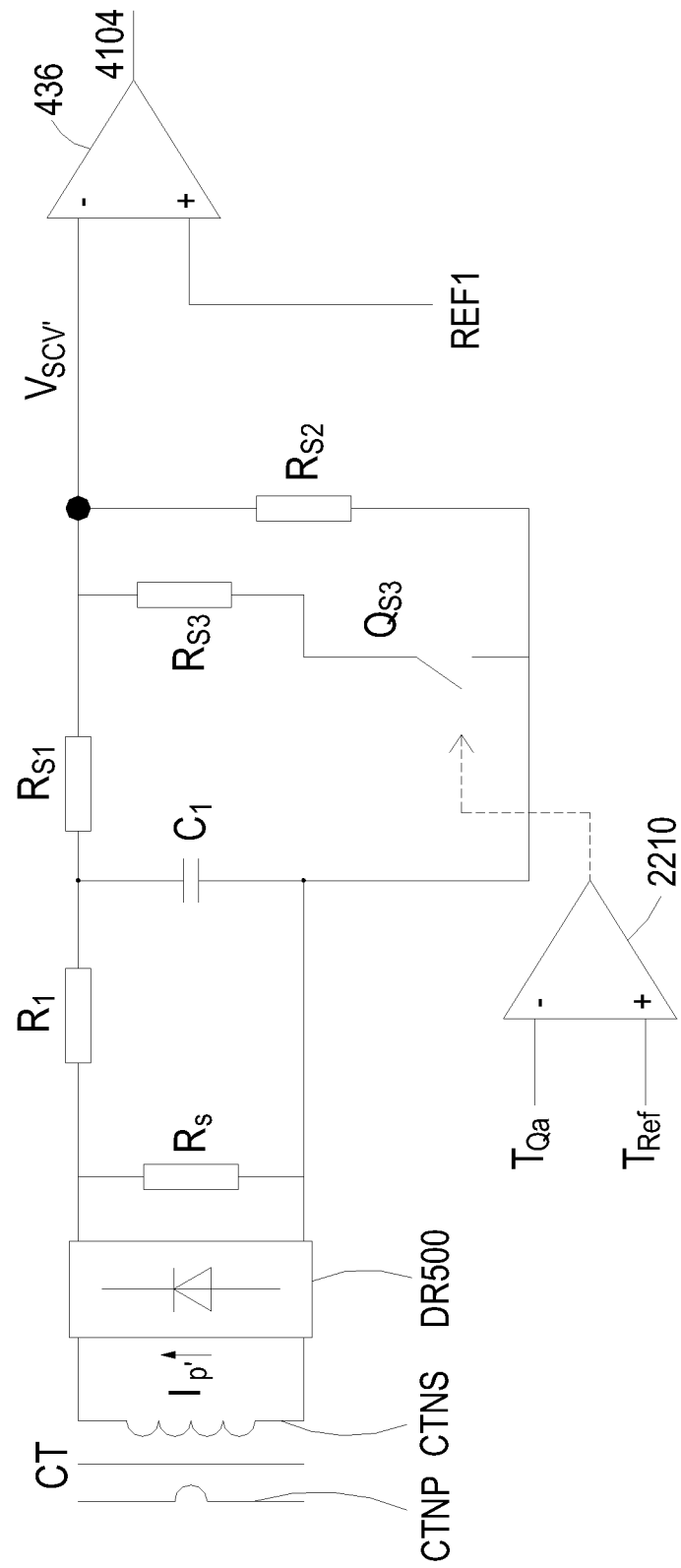
FIG. 22 shows an embodiment of the invention where the offsetting circuit is used as a protection circuit for the switch components in a power converter.

FIG. 22 shows an embodiment of the invention where the offsetting circuit is used as a protection circuit for the switch components in a power converter. As well known in the art, when the temperature of the switch components goes up, the conducting loss and switching loss of switch components will increase. If the output current of the power converter can be limited, it is helpful in alleviating the thermal stress of the switch components and protecting the switch components. In FIG. 22, the reference symbol $T_{Qa}$ denotes the temperature signal of the switch components Qa-Qd (shown in FIG. 5(A)) sensed by a temperature sensing probe (not shown), and the reference symbol $T_{ref}$ denotes a reference temperature signal, in which the reference temperature signal $T_{ref}$ is the maximum allowable temperature for the switch components Qa-Qd. In the instant embodiment, the control unit 1010 shown in FIG. 10 is implemented by a temperature compare unit 2210. The temperature compare unit 2210 is configured to compare the switch component temperature signal $T_{Qa}$ with the reference temperature signal $T_{ref}$. If the sensed temperature $T_{Qa}$ of the switch components Qa-Qd is higher than the reference temperature $T_{ref}$, the control switch Qs3 is turned off to amplify the compensated current sensing signal Vscv' such that the amplified compensated current sensing signal Vscv' is higher than the constant current reference signal REF1. Accordingly, the output current of the power converter can be limited at a lower level. The constant output current can be calculated by the following equation:

$$Ip' = REF1/(Rs1 \times Rs2/(Rs1+Rs2))$$ (equation 6)

If the sensed temperature $T_{Qa}$ of the switch components Qa-Qd is lower than the reference temperature $T_{ref}$, the control switch Qs3 is turned on to revert the compensated current sensing signal Vscv', such that the amplified compensated current sensing signal Vscv' is lower than the constant current reference signal REF1. Accordingly, the power converter resumes its normal operation. Under this condition, the output current of the power converter does not need to be limited any more. Also, the compensated current sensing signal Vscv' can be calculated by the foregoing equation 2. Therefore, the control unit 1010 can be used to control the switching of the control switch Qs3 in the offsetting circuit 434 according to the switch component temperature of the power converter.

Figure 23:
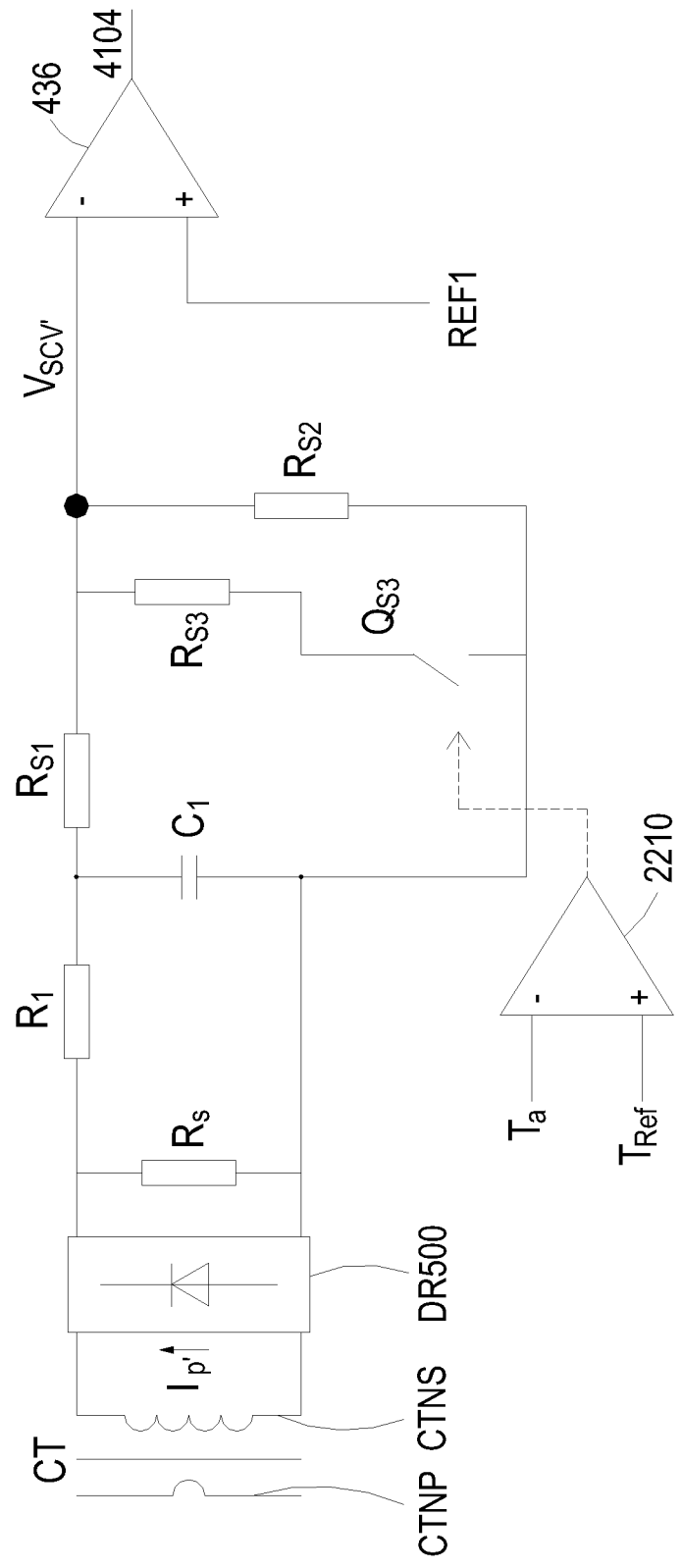
FIG. 23 shows an embodiment of the invention where the offsetting circuit is used as a protection circuit for the components in a power converter.

FIG. 23 shows an embodiment of the invention where the offsetting circuit is used as a protection circuit for the components in a power converter. As well known in the art, when the ambient temperature of the power converter goes up, the heat of the components of the power converter will increase rapidly. If the output current of the power converter can be limited, it is helpful in alleviating the thermal stress of the components and protecting the components of the power converter. In FIG. 23, the reference symbol $T_a$ denotes the ambient temperature signal of the power converter sensed by a temperature sensing probe (not shown), and the reference symbol $T_{ref}$ denotes a reference temperature signal, in which the reference temperature signal $T_{ref}$ is the maximum allowable ambient temperature for the power converter. In the instant embodiment, the control unit 1010 shown in FIG. 10 is implemented by a temperature compare unit 2210. The temperature compare unit 2210 is configured to compare the ambient temperature signal $T_a$ with the reference temperature signal $T_{ref}$. If the sensed ambient temperature $T_a$ of the power converter is higher than the reference temperature $T_{ref}$, the control switch Qs3 is turned off to amplify the compensated current sensing signal Vscv' such that the amplified compensated current sensing signal Vscv' is higher than the constant current reference signal REF1. Accordingly, the output current of the power converter can be limited at a lower level. The constant output current can be calculated by the foregoing equation 6. If the sensed ambient temperature $T_a$ of the power converter is lower than the reference temperature $T_{ref}$, the control switch Qs3 is turned on to revert the compensated current sensing signal Vscv', such that the amplified compensated current sensing signal Vscv' is lower than the constant current reference signal REF1. Accordingly, the power converter resumes its normal operation. Under this condition, the output current of the power converter does not need to be limited any more. Also, the compensated current sensing signal Vscv' can be calculated by the foregoing equation 2. Therefore, the control unit 1010 can be used to control the switching of the control switch Qs3 in the offsetting circuit 434 according to the ambient temperature of the power converter.

In conclusion, the invention contrives a current sensing technique and a current sensing signal comparing technique for the switching circuit in a power converter. The power converter according to the invention includes a switching circuit for converting an input voltage into an output voltage according to its switching operation, and a switching control circuit for manipulating the switching operation of the switching circuit. Further, the power converter of the invention includes a current sensing device for sensing a current signal of the switching circuit and generating a current sensing signal accordingly, in which the current sensing device includes an offsetting circuit for compensating the current sensing signal according to a relationship between the switching frequency of the switching circuit and a predetermined frequency, or according to a relationship between the output voltage of the switching circuit and a predetermined voltage, or according to a relationship between the switch component temperature of the switching circuit and a predetermined switch component temperature, or according to a relationship between the ambient temperature of the switching circuit and a predetermined ambient temperature, thereby outputting a compensated current sensing signal. The invention also proposes a constant current compare unit for generating a constant current control signal for driving the switching control circuit to maintain the output current of the power converter at a constant level. Or otherwise, the offsetting circuit can compensate the constant current reference signal of the constant current compare unit to generate a compensated constant current reference signal. Thus, the constant current compare unit may compare the compensated current sensing signal with the constant current reference signal, or compare the current sensing signal with the compensated constant current reference signal, thereby generating the constant current control signal. It is noteworthy that the compensated current sensing signal may be transmitted to the switching control circuit to facilitate the switching control circuit to monitor the output current.

While the present invention has been described in terms of what are presently considered to be the most practical and preferred embodiments, it is to be understood that the present invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A current sensing device for a switching circuit, comprising:
   a current sensing circuit for sensing a current signal of the switching circuit and outputting a current sensing signal accordingly;
   a control unit for outputting a control signal according to a relationship between a switching frequency of the switching circuit and a predetermined frequency, or according to a relationship between an output voltage of the switching circuit and a predetermined voltage, or according to a relationship between a switch component temperature of the switching circuit and a predetermined switch component temperature, or according to a relationship between an ambient temperature of the switching circuit and a predetermined ambient temperature; and
   an offsetting circuit connected to the control unit for compensating the current sensing signal according to the control signal.

2. The current sensing device according to claim 1 wherein the switching circuit is a resonant circuit.

3. The current sensing device according to claim 1 wherein the offsetting circuit comprises:
   at least one resistor; and
   one or more control switches, each control switch has a first current-conducting terminal connected to one of the at least one resistor, a control terminal connected to the control unit, and a second current-conducting terminal;
   wherein the control unit is configured to manipulate the at least one control switch according to the relationship between the switching frequency of the switching circuit and the predetermined frequency, or according to the relationship between the output voltage of the switching circuit and the predetermined voltage, or according to the relationship between the switch component temperature of the switching circuit and the predetermined switch component temperature, or according to the relationship between the ambient temperature of the switching circuit and the predetermined ambient temperature, and thereby compensating the current sensing signal to generate the compensated current sensing signal.

4. The current sensing device according to claim 3 wherein the offsetting circuit further comprises:
   at least one capacitor connected in parallel to the at least one control switch of the offsetting circuit for smoothing the compensated current sensing signal.

5. The current sensing device according to claim 1 wherein the offsetting circuit comprises:
   a linear variable resistor configured to adaptively control the resistance thereof according to the control signal, thereby compensating the current sensing signal to generate a compensated current sensing signal.

6. The current sensing device according to claim 1 wherein the current sensing circuit comprises:
   a current transformer having a primary winding connected to a sub-circuit of the switching circuit in series for sensing a current signal of the sub-circuit and a secondary winding for inducing a current signal in proportion to a primary current of the transformer;
   a rectifier connected in parallel to the secondary winding of the current transformer for rectifying the current signal induced by the current transformer, thereby generating a rectified current signal;
   a current sensing resistor connected in parallel to the rectifier for receiving the rectified current signal and generating a voltage signal;
   a filter connected in parallel to the current sensing resistor for removing high-frequency noises from the voltage signal; and
   a voltage divider connected in parallel to an output terminal of the filter and including a pair of serially-connected resistors for dividing the voltage signal to generate the current sensing signal.

7. The current sensing device according to claim 6 wherein the offsetting circuit comprises:
   a tap mounted on the secondary winding of the current transformer; and
   at least one control switch connected to the tap;
   wherein the control unit is connected to a control terminal of the at least one control switch for controlling the switching operation of the at least one control switch, thereby controlling the turn ratio of the current transformer.

8. The current sensing device according to claim 6 wherein the offsetting circuit comprises:
   a current source connected to an output terminal of the rectifier;
   wherein the control unit is connected to the current source for determining whether the current source is allowed to inject current into the current sensing circuit or allowed to draw current from the current sensing circuit.

9. A current sensing signal comparing device for a switching circuit, comprising:
   a current sensing circuit for sensing a current signal of the switching circuit and outputting a current sensing signal accordingly;
   a control unit for outputting a control signal according to a relationship between a switching frequency of the switching circuit and a predetermined frequency, or according to a relationship between an output voltage of the switching circuit and a predetermined voltage, or according to a relationship between a switch component temperature of the switching circuit and a predetermined switch component temperature, or according to a relationship between an ambient temperature of the switching circuit and a predetermined ambient temperature;
   an offsetting circuit connected to the control unit, wherein the offsetting circuit is configured to compensate a first signal selected from a group consisting of the current sensing signal and a constant current reference signal to generate a second signal; and
   a constant current compare unit having a first input terminal receiving the second signal and having a second input terminal receiving a third signal selected from the group consisting of the current sensing signal and a constant current reference signal which is different from the first signal to generate a constant current control signal.

10. The current sensing signal comparing device according to claim 9 wherein the first signal is the current sensing signal.

11. The current sensing signal comparing device according to claim 9 wherein the first signal is the constant current reference signal and the offsetting circuit comprises:
   a voltage divider configured for dividing and transmitting the constant current reference signal to the first input terminal of the constant current compare unit and including a pair of serially-connected resistors;
   at least one resistor connected in parallel with one resistor of the voltage divider; and
   one or more control switches, each control switch has a first current-conducting terminal connected to one of the at least one resistor, a control terminal connected to the control unit, and a second current-conducting terminal connected to a ground terminal;
   wherein the control unit is configured to manipulate the at least one control switch to allow the resistor connected therewith to be attached to the voltage divider or detached from the voltage divider according to the relationship between the switching frequency of the switching circuit and the predetermined frequency, or according to the relationship between the output voltage of the switching circuit and the predetermined voltage, or according to the relationship between the switch component temperature of the switching circuit and the predetermined switch component temperature, or according to the relationship between the ambient temperature of the switching circuit and the predetermined ambient temperature, and thereby compensating the constant current reference signal to generate the compensated constant current reference signal.

12. A current sensing signal comparing method for a switching circuit, comprising the steps of:
   sensing a current signal of the switching circuit to generate a current sensing signal;
   receiving a constant current reference signal;
   generating a control signal according to a relationship between a switching frequency of the switching circuit and a predetermined frequency, or according to a relationship between an output voltage of the switching circuit and a predetermined voltage, or according to a relationship between a switch component temperature of the switching circuit and a predetermined switch component temperature, or according to a relationship between an ambient temperature of the switching circuit and a predetermined ambient temperature;
   compensating a first signal selected from a group consisting of the current sensing signal and the constant current reference signal to generate a second signal according to the control signal; and
   comparing the second signal and a third signal selected from a group consisting of the current sensing signal and the constant current reference signal being different from the first signal to generate a constant current control signal.

13. The current sensing signal comparing method according to claim 12 wherein the first signal is the current sensing signal.

14. The current sensing signal comparing method according to claim 12 wherein the first signal is the constant current reference signal.

15. A current sensing method for a switching circuit, comprising the steps of:
   sensing a current signal of the switching circuit to generate a current sensing signal;
   generating a control signal according to a relationship between a switching frequency of the switching circuit and a predetermined frequency, or according to a relationship between an output voltage of the switching circuit and a predetermined voltage, or according to a relationship between a switch component temperature of the switching circuit and a predetermined switch component temperature, or according to a relationship between an ambient temperature of the switching circuit and a predetermined ambient temperature; and
   compensating the current sensing signal according to the control signal to generate a compensated current sensing signal.

* * * * *